(12) United States Patent
Wang et al.

(10) Patent No.: US 12,062,615 B2
(45) Date of Patent: Aug. 13, 2024

(54) MEMORY DEVICE

(71) Applicant: MACRONIX International Co., Ltd., Hsinchu (TW)

(72) Inventors: Ching Hung Wang, Hsinchu (TW); Shih Chin Lee, Taichung (TW); Chen-Yu Cheng, Hsinchu (TW); Tzung-Ting Han, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 75 days.

(21) Appl. No.: 18/164,626

(22) Filed: Feb. 6, 2023

(65) Prior Publication Data
US 2023/0187359 A1    Jun. 15, 2023

Related U.S. Application Data

(63) Continuation of application No. 17/109,960, filed on Dec. 2, 2020, now Pat. No. 11,610,842.

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76895* (2013.01);
(Continued)

(58) Field of Classification Search
CPC ............. H01L 23/535; H01L 23/5226; H01L 23/5283; H01L 21/76805; H01L 21/76895; H10B 41/27; H10B 41/41; H10B 41/50; H10B 41/30; H10B 43/27; H10B 43/40; H10B 43/50; H10B 43/30
See application file for complete search history.

(56) References Cited

U.S. PATENT DOCUMENTS 8,704,288 B2    4/2014  Lee et al.
9,343,452 B2    5/2016  Yun et al.
(Continued)

FOREIGN PATENT DOCUMENTS

TW      I683417       1/2020
WO    2019099103      5/2019

*Primary Examiner* — Shahed Ahmed
*Assistant Examiner* — Vicki B. Booker
(74) *Attorney, Agent, or Firm* — J.C. PATENTS

(57) ABSTRACT

Provided is a memory device including a substrate, a stack structure, a plurality of pads and an additional dielectric layer. The substrate has an array region and a staircase region. The stack structure is disposed on the substrate. The stack structure includes a plurality of dielectric layers and a plurality of conductive layers stacked alternately. The pads are disposed on the substrate in the staircase region. The pads are respectively connected to the conductive layers, so as to form a staircase structure. The additional dielectric layer is disposed on the stack structure to contact a topmost conductive layer of the conductive layers. A topmost pad of the pads includes a landing portion to contact a plug and an extension portion. The landing portion is laterally adjacent to the additional dielectric layer, and the extension portion extends over a top surface of the additional dielectric layer.

20 Claims, 25 Drawing Sheets

(51) Int. Cl.
  *H01L 23/522* (2006.01)
  *H01L 23/528* (2006.01)
  *H10B 41/27* (2023.01)
  *H10B 41/41* (2023.01)
  *H10B 43/27* (2023.01)
  *H10B 43/40* (2023.01)

(52) U.S. Cl.
  CPC ...... *H01L 23/5226* (2013.01); *H01L 23/5283* (2013.01); *H10B 41/27* (2023.02); *H10B 41/41* (2023.02); *H10B 43/27* (2023.02); *H10B 43/40* (2023.02)

(56) References Cited

U.S. PATENT DOCUMENTS

| | | |
|---|---|---|
| 9,419,013 B1 | 8/2016 | Lee et al. |
| 10,103,170 B2 | 10/2018 | Jang et al. |
| 10,700,089 B1 | 6/2020 | Hojo et al. |
| 2017/0271256 A1* | 9/2017 | Inatsuka ........... H01L 21/76816 |
| 2020/0091071 A1* | 3/2020 | Lee .................. H01L 21/76832 |

* cited by examiner

MEMORY DEVICE

CROSS REFERENCE TO RELATED APPLICATION

This application is a continuation application of and claims the priority benefit of U.S. application Ser. No. 17/109,960, filed on Dec. 2, 2020. The entirety of the above-mentioned patent application is hereby incorporated by reference herein and made a part of specification.

BACKGROUND OF THE INVENTION

Field of the Invention

The present invention relates to a semiconductor device, and in particular relates to a memory device.

Description of Related Art

With the continuous development of science and technology, the demands for greater storage capacity also increase as electronic devices continue to improve. To satisfy the demands for high storage density, memory devices become smaller in size and have higher integrity. Therefore, the form of memory devices has developed from 2D memory devices having a planar gate structure to 3D memory devices having a vertical channel (VC) structure.

In general, conductive layers with a staircase structure often serves as pads in the 3D memory device, and the pads and contacts thereon often act as the interconnection structures to connect components in each layer to other components. However, when a contact landing pad (CLP) process is performed, a topmost oxide layer close to the polishing stop layer is etched during the CLP process to form a recess. The recess will further damage the underlying sacrificial layer. Therefore, after performing a gate replacement process, the topmost word line has an indented structure between the staircase region and the array region, thereby resulting in the topmost word line with a high resistance, or generating an open issue that causes the failure of the gate control on string select line (SSL).

SUMMARY OF THE INVENTION

The invention provides a memory device in which the thickness of the topmost conductive layer between the staircase region and the array region can be maintained to reduce the resistance value of the topmost conductive layer, thereby improving the gate control of the topmost conductive layer.

The invention provides a memory device including a substrate, a stack structure, a plurality of pads and an additional dielectric layer. The substrate has an array region and a staircase region. The stack structure is disposed on the substrate. The stack structure includes a plurality of dielectric layers and a plurality of conductive layers stacked alternately. The pads are disposed on the substrate in the staircase region. The pads are respectively connected to the conductive layers, so as to form a staircase structure. The additional dielectric layer is disposed on the stack structure to contact a topmost conductive layer of the conductive layers. A topmost pad of the pads includes a landing portion to contact a plug and an extension portion. The landing portion is laterally adjacent to the additional dielectric layer, and the extension portion extends over a top surface of the additional dielectric layer.

In one embodiment of the invention, the memory device further includes at least one plug connected to the landing portion of the topmost pad.

In one embodiment of the invention, the at least one plug and the topmost pad have a same material.

In one embodiment of the invention, each pad of the plurality of pads and a corresponding conductive layer connecting thereto are located at a same level.

In one embodiment of the invention, the plurality of pads are respectively laterally connected to the plurality of conductive layers.

In one embodiment of the invention, the memory device further includes a plurality of plugs connected to respective pads in the plurality of pads.

In one embodiment of the invention, pads in the plurality of pads have a thickness greater than or equal to a thickness of the respective conductive layers.

In one embodiment of the invention, the substrate further comprises a complementary metal oxide semiconductor under array.

In one embodiment of the invention, the extension portion has an extension distance from an edge of the additional dielectric layer to an end of the extension portion.

In one embodiment of the invention, the topmost conductive layer is a string select line (SSL).

The invention provides a memory device including a substrate, a stack structure, a plurality of pads and an additional dielectric layer. The substrate has an array region and a staircase region. The stack structure is disposed on the substrate. The stack structure includes a plurality of dielectric layers and a plurality of conductive layers stacked alternately. The pads are disposed on the substrate in the staircase region. The pads are respectively connected to the conductive layers, so as to form a staircase structure. The additional dielectric layer is disposed on the stack structure to contact a topmost conductive layer of the conductive layers. A topmost pad of the pads includes a landing portion to contact a plug and an extension portion. The landing portion is not covered the additional dielectric layer, and the extension portion covers a top surface of the additional dielectric layer.

In one embodiment of the invention, the memory device further includes at least one plug connected to the landing portion of the topmost pad.

In one embodiment of the invention, the at least one plug and the topmost pad have a same material.

In one embodiment of the invention, each pad of the plurality of pads and a corresponding conductive layer connecting thereto are located at a same level.

In one embodiment of the invention, the plurality of pads are respectively laterally connected to the plurality of conductive layers.

In one embodiment of the invention, the memory device further includes a plurality of plugs connected to respective pads in the plurality of pads.

In one embodiment of the invention, pads in the plurality of pads have a thickness greater than or equal to a thickness of the respective conductive layers.

In one embodiment of the invention, the substrate further comprises a complementary metal oxide semiconductor under array.

In one embodiment of the invention, the extension portion has an extension distance from an edge of the additional dielectric layer to an end of the extension portion.

In one embodiment of the invention, the topmost conductive layer is a string select line.

Based on the above, in the embodiment of the present invention, a thicker protective layer is used to protect the underlying sacrificial layer, so that the topmost sacrificial layer between the staircase region and the array region will not be consumed. Therefore, after the gate replacement process, the topmost conductive layer is able to maintain a certain thickness to reduce the resistance of the topmost conductive layer, thereby improving the gate control of the topmost conductive layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
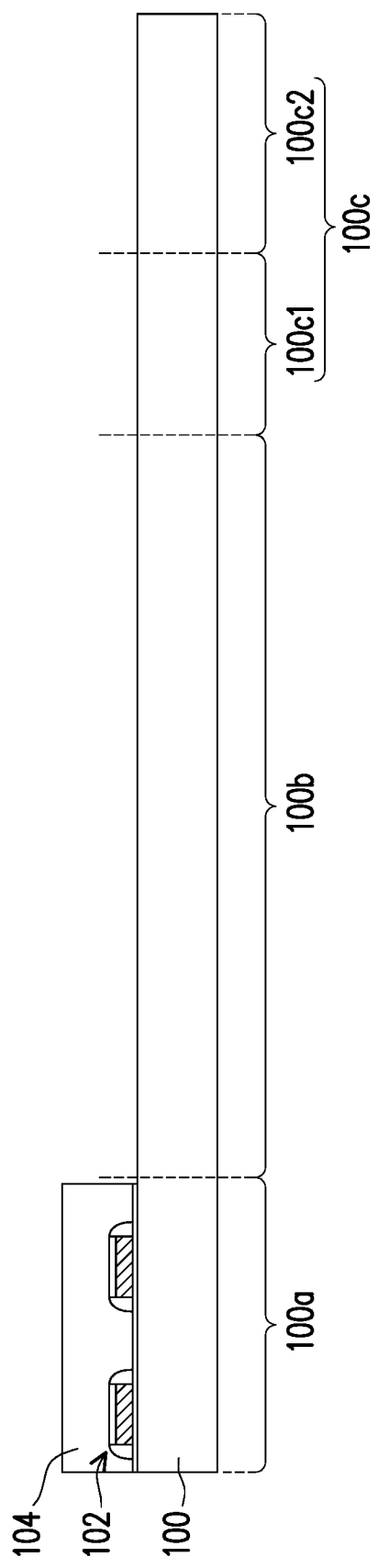
FIG. 1 to FIG. 25 are schematic cross-sectional views illustrating a manufacturing process of a memory device according to an embodiment of the invention.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1 to FIG. 25 are schematic cross-sectional views illustrating a manufacturing process of a memory device according to an embodiment of the invention.

Figure 25:
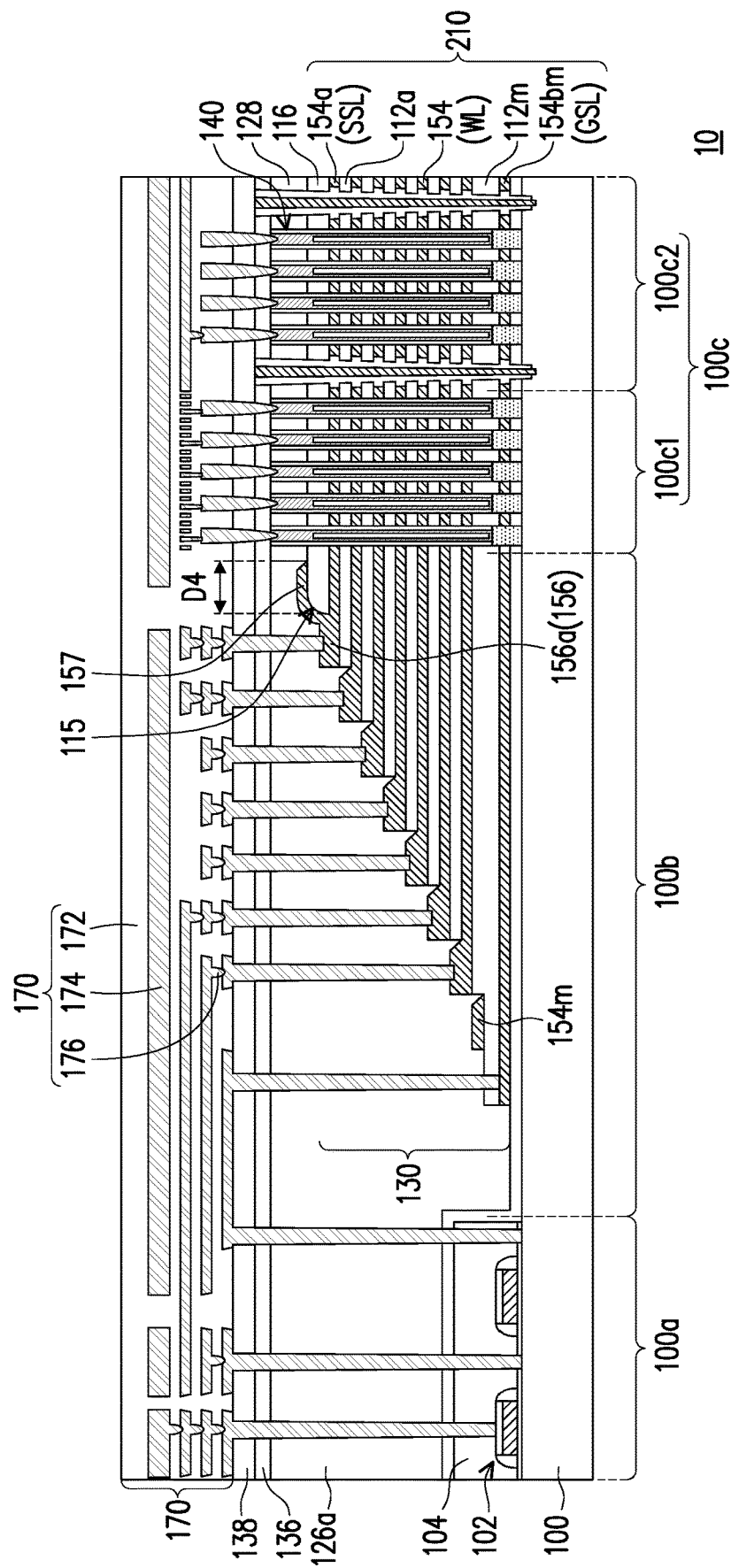

Referring to FIG. 1, a method of manufacturing a memory device 10 (as shown in FIG. 25) includes following steps. First, a substrate 100 is provided. In one embodiment, the substrate 100 includes a semiconductor substrate, such as a silicon substrate. The substrate 100 includes a peripheral region 100a, a staircase region 100b, and an array region 100c. The staircase region 100b is located between the peripheral region 100a and the array region 100c. The array region 100c includes a first array region 100c1 and a second array region 100c2. In an embodiment, the array region 100c may be, for example, a memory cell array region. The first array region 100c1 may be, for example, a cross section extending along a word-line direction; and the second array region 100c2 may be, for example, a cross section extending along a bit-line direction.

Next, a plurality of metal oxide semiconductor (MOS) devices 102 are formed on the substrate 100 in the peripheral region 100a, such as N-type metal oxide semiconductor (NMOS) transistors, P-type metal oxide semiconductor (PMOS) transistors, or a combination thereof. The MOS devices 102 are well known to those with ordinary knowledge in the art, and will not be described in detail here.

After forming the MOS devices 102, a dielectric layer 104 is formed to cover a surface of the MOS devices 102 and a surface of the substrate 100 in the peripheral region 100a. In an embodiment, a material of the dielectric layer 104 includes a dielectric material, such as silicon oxide, silicon nitride, silicon oxynitride, and the like.

Figure 2:
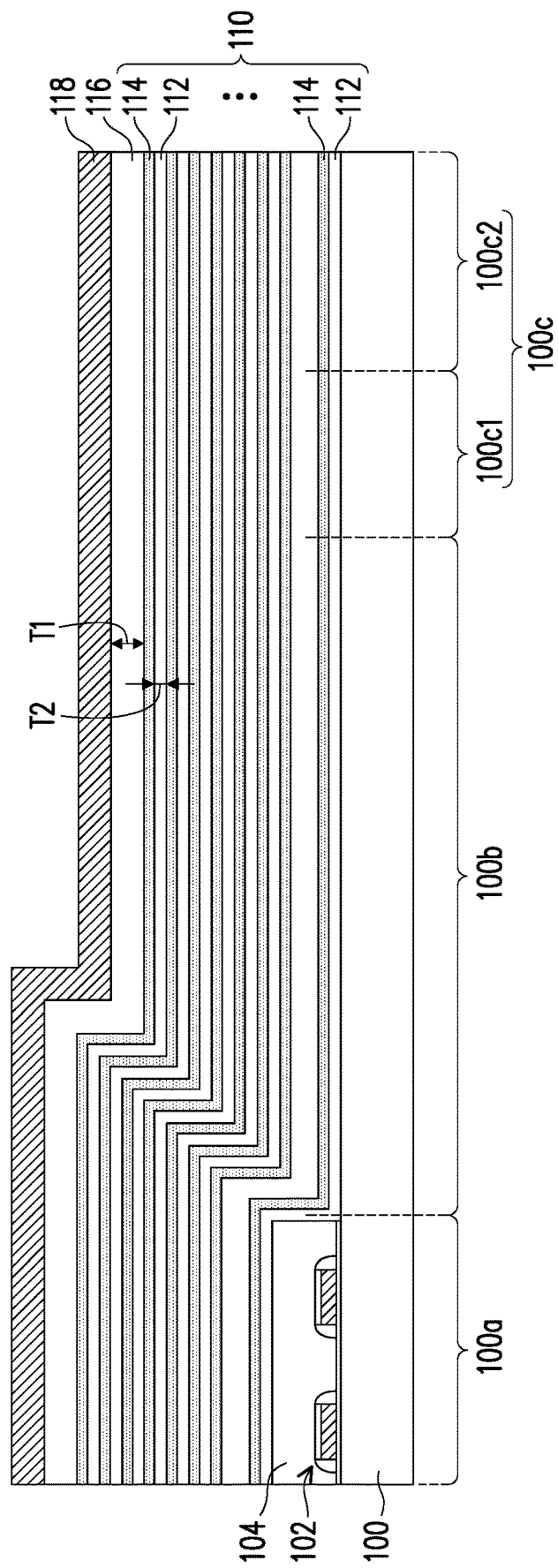

Referring to FIG. 2, a stack layer 110 is formed on the substrate 100. Specifically, the stack layer 110 includes a plurality of dielectric layers 112 and a plurality of sacrificial layers 114 stacked alternately. In an embodiment, the dielectric layers 112 and the sacrificial layers 114 may have different dielectric materials. For example, the dielectric layers 112 may be silicon oxide layers; the sacrificial layers 114 may be silicon nitride layers. However, the present invention is not limited thereto. In other embodiments, the dielectric layers 112 may be silicon oxide layers; and the sacrificial layers 114 may be polysilicon layers. In one embodiment, the number of dielectric layers 112 and sacrificial layers 114 may be 8, 16, 32, 64, or more layers.

Thereafter, a protective layer 116 and a stop layer 118 are formed on the stack layer 110. In an embodiment, a material of the stop layer 118 includes polysilicon, silicon nitride, silicon oxynitride, high-k aluminum oxide, metal silicide (e.g., CoSi, TiSi, NiSi, etc.), metal (e.g., W, Al, etc.), or a combination thereof. In the embodiment, the protective layer 116 and the dielectric layers 112 may have the same material; and the protective layer 116 and the stop layer 118 may have different materials. For example, the protective layer 116 and the dielectric layers 112 may be silicon oxide layers, and the stop layer 118 may be polysilicon layers. It should be noted that the protective layer 116 may have a thickness T1 greater than a thickness T2 of the dielectric layers 112 to protect the underlying sacrificial layers 114 from being damaged by the subsequent etching process. In one embodiment, a ratio of the thickness T1 to the thickness T2 is about 2:1 to 10:1.

Figure 3:
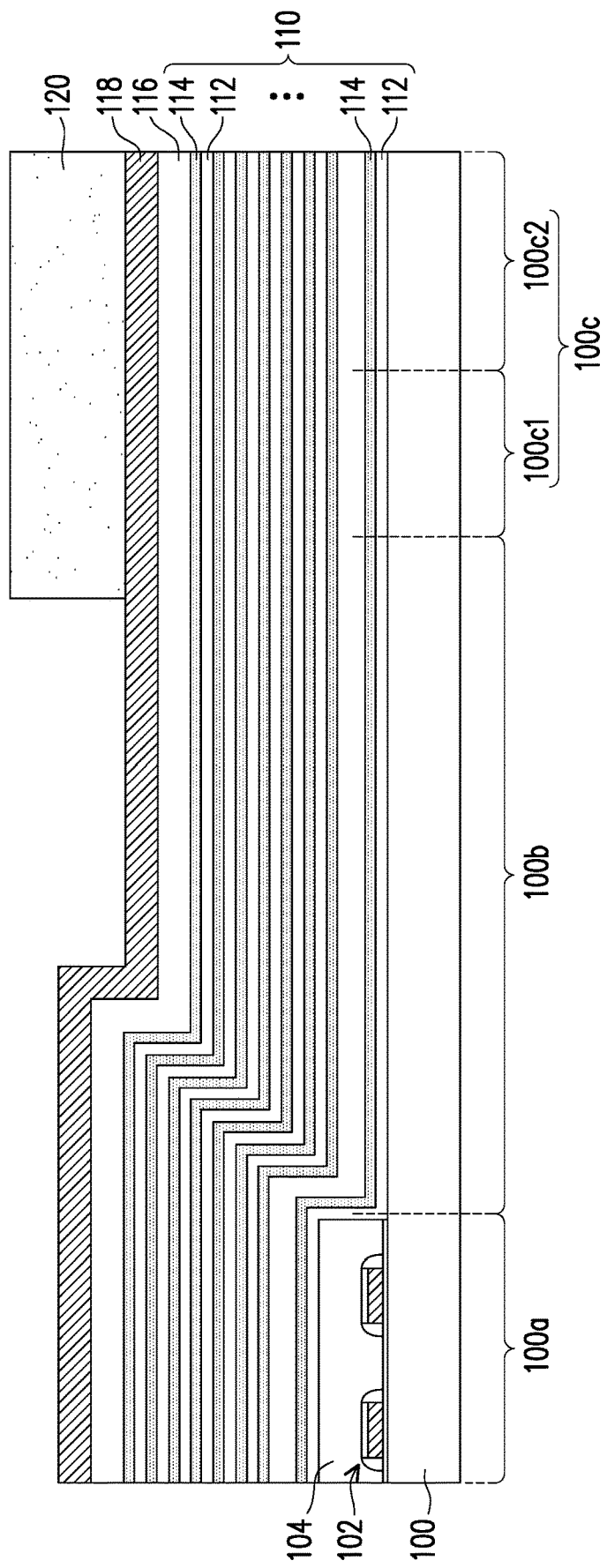

Referring to FIG. 3, a mask pattern 120 is formed on the stop layer 118. The mask pattern 120 is disposed on the array region 100c and extends to cover a portion of a top surface of the stop layer 118 in the staircase region 100b. In one embodiment, a material of the mask pattern 120 includes positive photoresist or negative photoresist.

Figure 4:
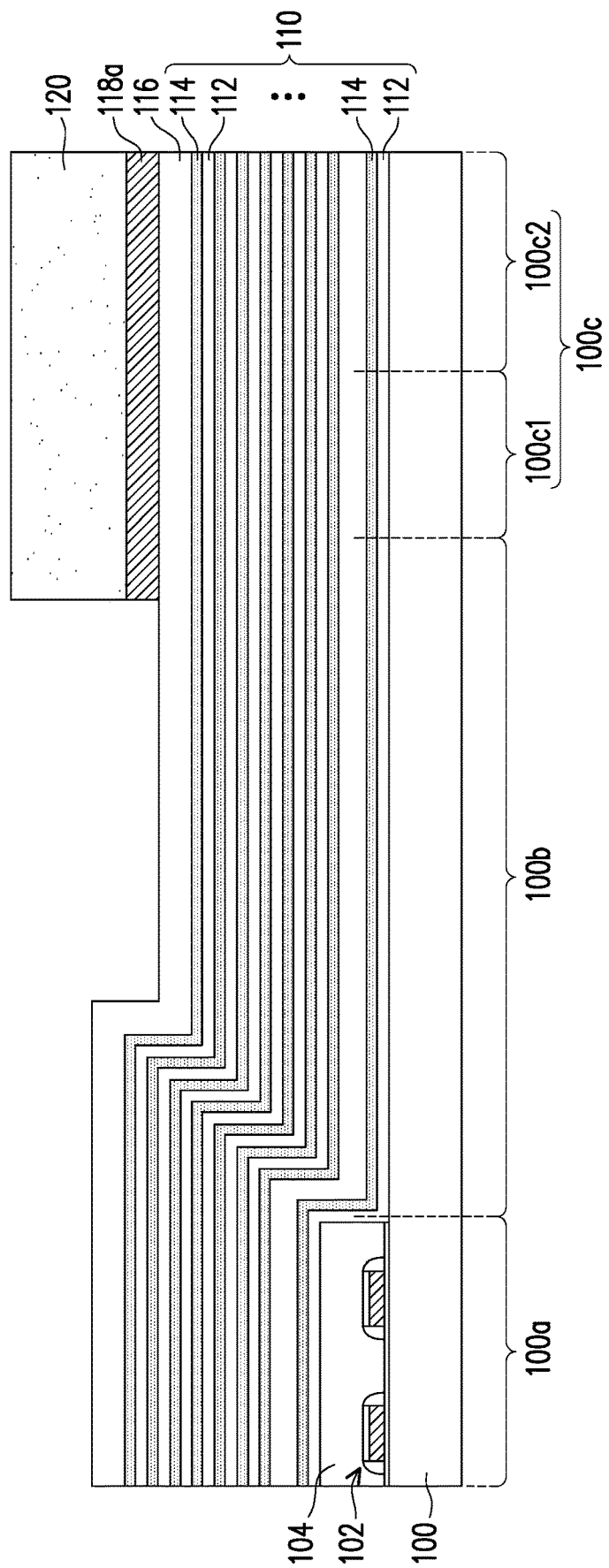

Referring to FIG. 4, by using the mask pattern 120 as a mask, a portion of the stop layer 118 is removed until a top surface of the protective layer 116 in the peripheral region 100a and the staircase region 100b is exposed. The remaining portion of the stop layer 118a is remained.

Figure 5:
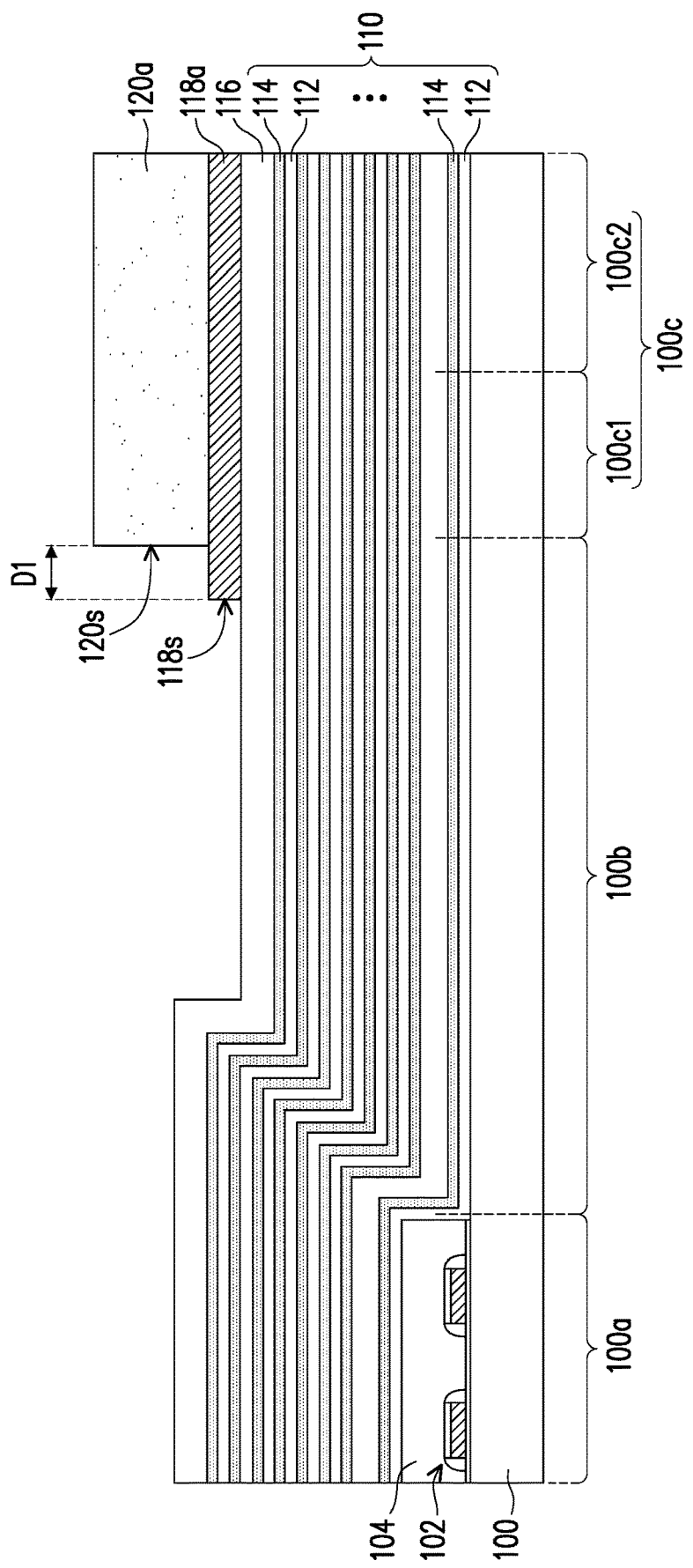

Referring to FIG. 5, the mask pattern 120 is trimmed, so that the trimmed mask pattern 120a is disposed on the array region 100c. Specifically, a sidewall 120s of the mask pattern 120a is indented along a direction toward the array region 100c, so that the sidewall 120s of the mask pattern 120a and a sidewall 118s of the stop layer 118a are separated by a distance D1. In an embodiment, the distance D1 may be 100 nm to 1000 nm.

Figure 6:
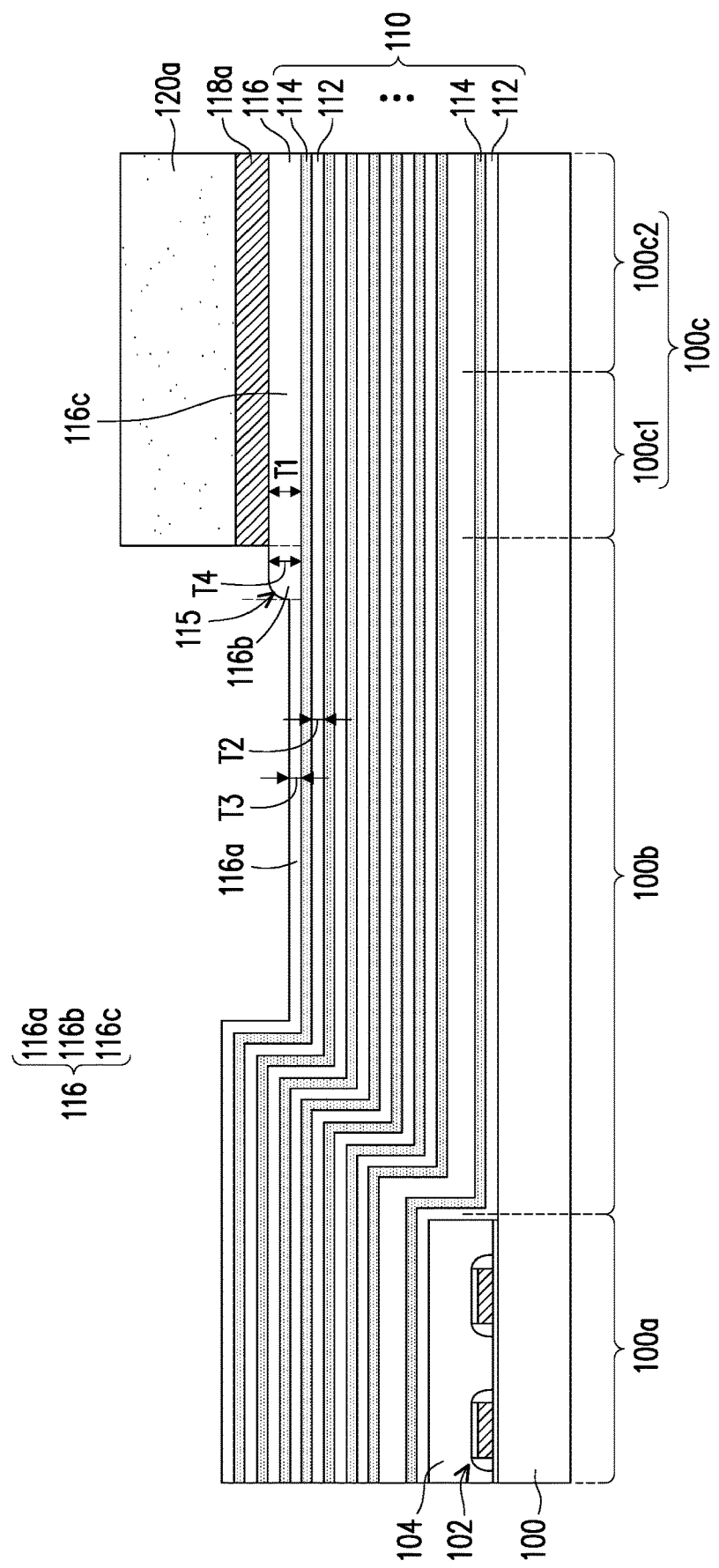

Referring to FIG. 6, a first etching process is performed to remove the stop layer 118a and the underlying protective layer 116 that is not covered by the mask pattern 120a. In one embodiment, the first etching process includes a dry etching process, such as a reactive ion etching (RIE) process. In this case, the protective layer 116 is etched to remain a first portion 116a, a second portion 116b, and a third portion 116c. In detail, the first portion 116a is located on the peripheral region 100a and the staircase region 100b, and has a thickness T3. The third portion 116c is located on the array region 100c and has a thickness T1. The second portion 116b connects the first portion 116a and the third portion 116c, and has a curved top surface 115. In the embodiment, since the third portion 116c is not removed by the first etching process, the third portion 116c maintains the original deposition thickness T1 of the protective layer 116. In addition, the first portion 116a is removed by the first etching process to form a thinner thickness T3. In one embodiment, a ratio of the thickness T3 to the thickness T2 of the underlying dielectric layers 112 is about 1:1. That is, a ratio of the thickness T1 of the third portion 116c to the thickness T3 of the first portion 116a is approximately 2:1 to 10:1. Further, since the second portion 116b is located between the first portion 116a and the third portion 116c, a portion of the second portion 116b near the third portion 116c still maintains a certain thickness, while another portion of the second portion 116b near the first portion 116a has a thinner thickness. In this case, a thickness T4 of the second portion 116b gradually decreases along a direction from the third portion 116c toward the first portion 116a, thereby forming the curved top surface 115.

Figure 7:
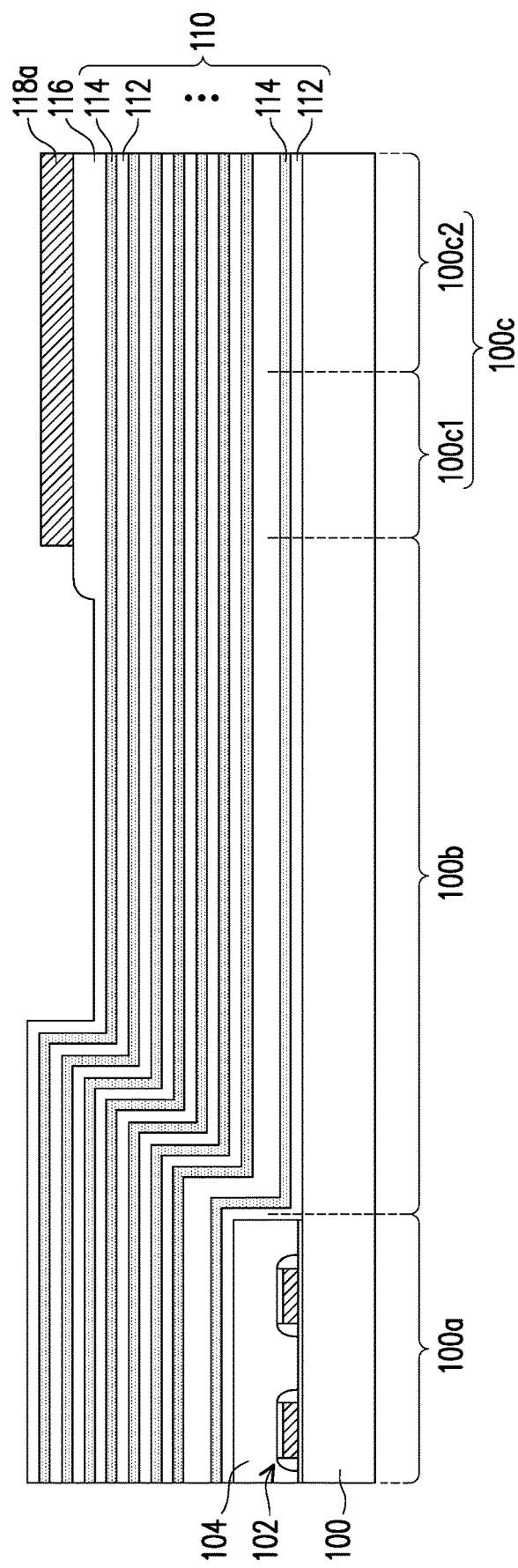

Referring to FIG. 7, the mask pattern 120a is removed to expose a top surface of the underlying stop layer 118a.

Figure 8:
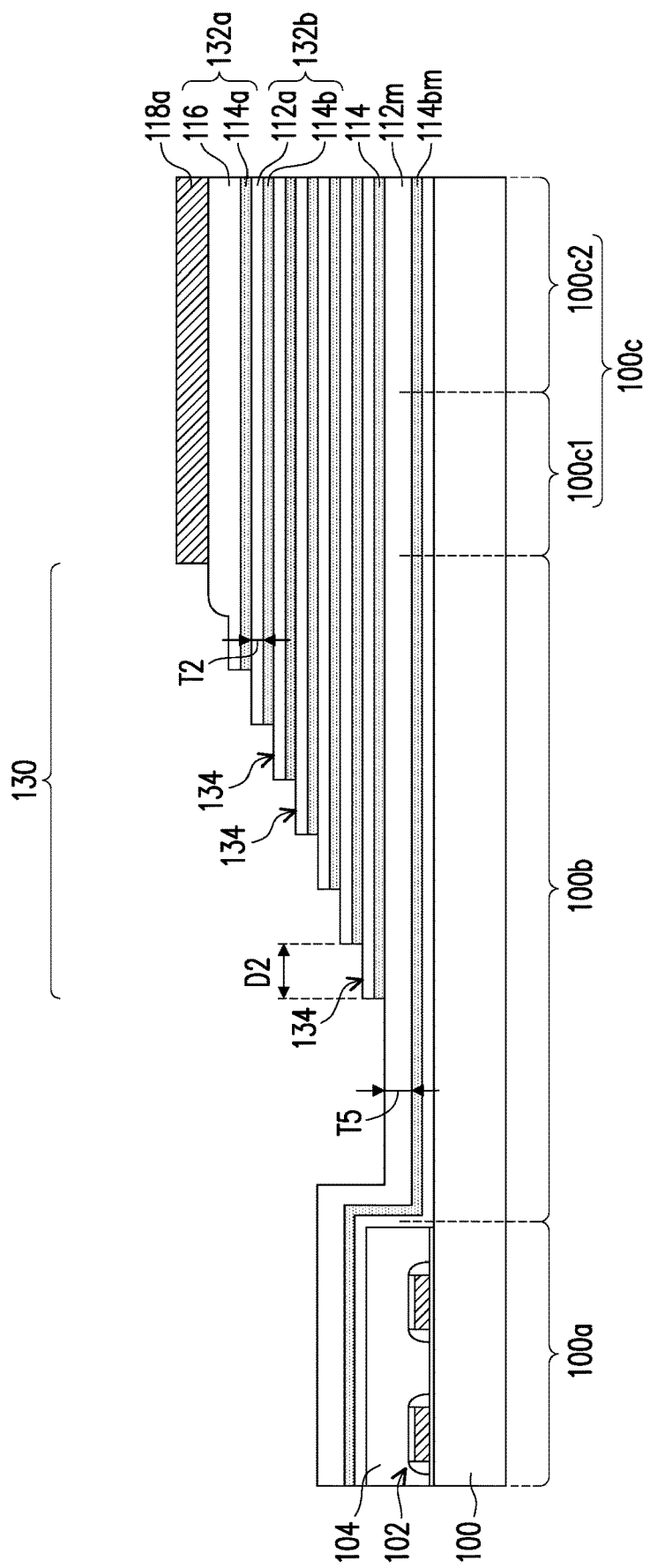

Referring to FIG. 8, a staircase trimming process is performed to pattern the stack layer 110 on the staircase region 100b, thereby forming a staircase structure 130. Specifically, a photoresist layer (not shown) is firstly formed to expose the stack layer 110 on the peripheral region 100a and the stack layer 110 on a portion of the staircase region 100b close to the peripheral region 100a. Next, by using the photoresist layer as a mask, a topmost material pair 132a (including the protective layer 116 and the topmost sacrificial layers 114a) in the stack layer 110 exposed by the photoresist layer is removed. Then, the photoresist layer is trimmed to recess the sidewall of the trimmed photoresist layer along a direction toward the array region 100c by a distance D2. In the embodiment, the distance D2 is approximately equal to a width of one stair 134 in the staircase structure 130. Afterwards, by using the trimmed photoresist layer as a mask, a second material pair 132b (including the topmost dielectric layer 112a and the sacrificial layer 114b) and the topmost material pair 132a (including the protective layer 116 and the topmost sacrificial layers 114a) in the stack layer 110 exposed by the trimmed photoresist layer is removed. Then, the photoresist trimming process and the removal process are performed more times to form the staircase structure 130 with a plurality of stairs 134. After the staircase trimming process, as shown in FIG. 8, the staircase structure 130 is located on the dielectric layer 112m. The dielectric layer 112m may have a thickness T5 greater than the thickness T2 of the other dielectric layers 112 to separate the bottommost sacrificial layer 114bm from other sacrificial layers 114.

Figure 9:
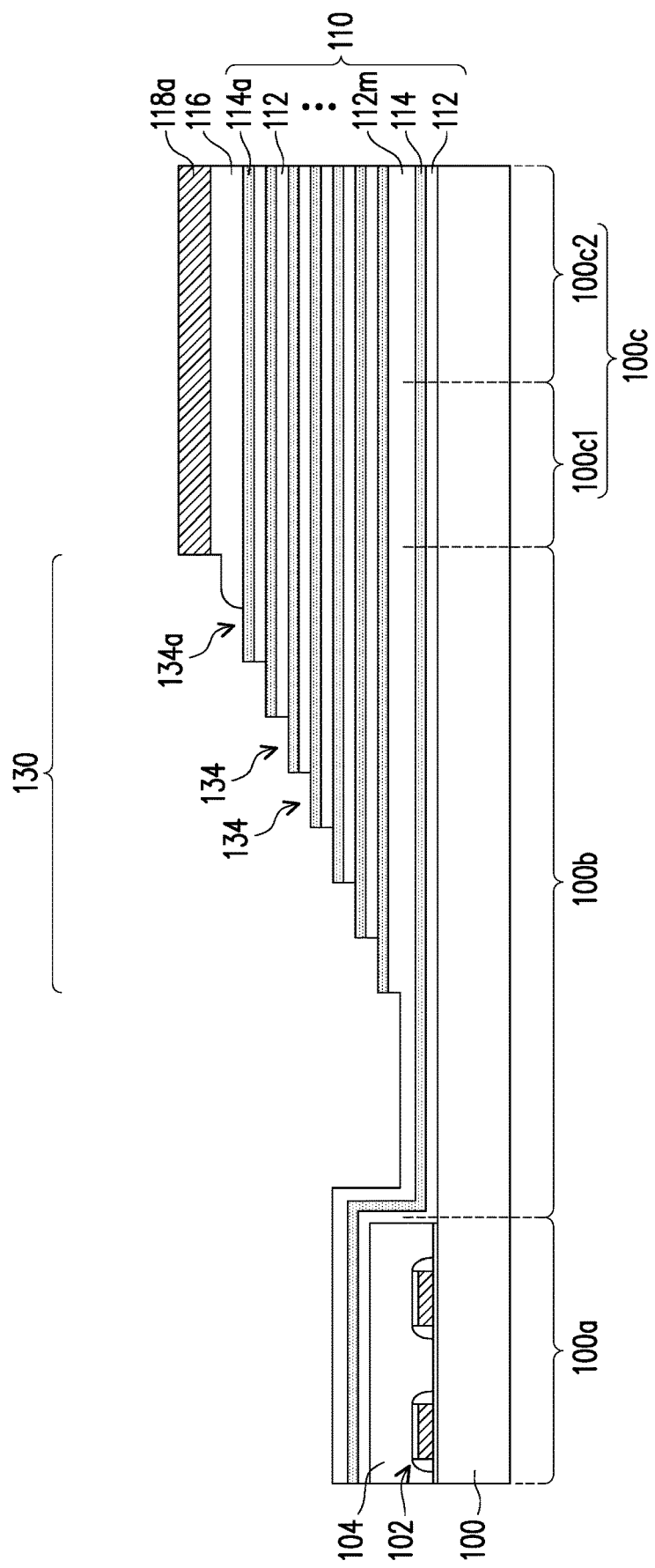

Referring to FIG. 8 and FIG. 9, a second etching process is performed to remove the dielectric layer 112 on each stair 134 and the protective layer 116 on the topmost stair 134a, thereby exposing top surfaces of the sacrificial layers 114. In addition, the dielectric layer 112m exposed by the staircase structure 130 may also be thinned. In an embodiment, the second etching process may include a dry etching process, a wet etching process, or a combination thereof.

Figure 10:
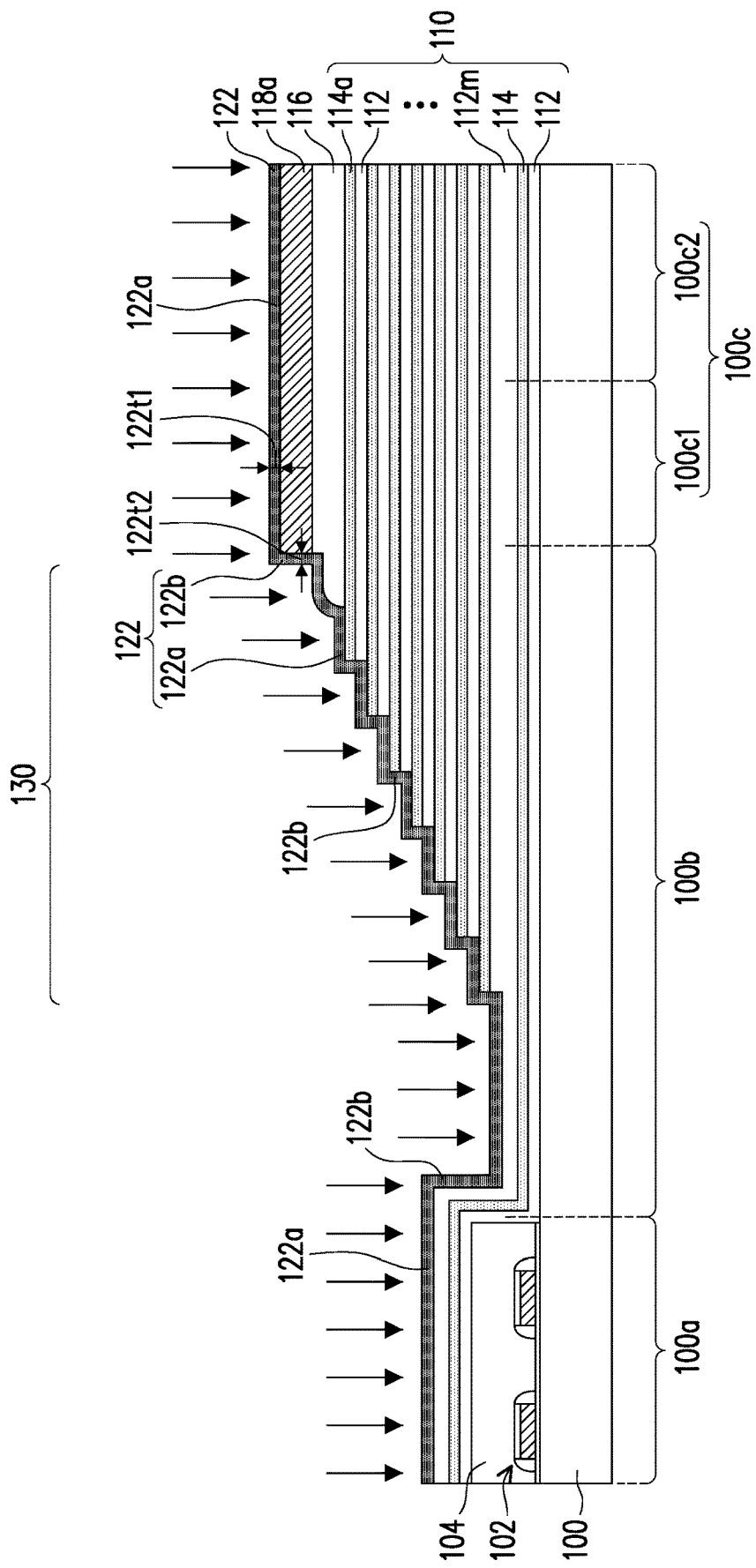

Referring to FIG. 10, a hard mask layer 122 is formed to conformally cover a surface of the structure of FIG. 9. In an embodiment, a material of the hard mask layer 122 includes a nitrogen-containing material, such as silicon nitride; the hard mask layer 122 may be formed by chemical vapor deposition (CVD). It should be noted that, in the embodiment, the hard mask layer 122 may be silicon nitride that has been performed a hardening treatment, so that the density and the hardness of the hard mask layer 122 are greater than those of general CVD silicon nitride. In some embodiments, the hardening treatment may include a nitridation treatment, an Ar ion-bombardment treatment, or a combination thereof. However, the present invention is not limited to thereto, basically, other hardening treatments that can increase the density and the hardness of the hard mask layer 122 are also within the scope of the present invention. In addition, due to the difference in coverage of the hard mask layer 122 on the top surface and the sidewall, the hard mask layer 122 may include a top surface portion 122a and a sidewall portion 122b. As shown in FIG. 10, the top surface portion 122a has a thickness 122t1, and the sidewall portion 122b has a thickness 122t2. In one embodiment, the thickness 122t1 of the top surface portion 122a is greater than the thickness 122t2 of the sidewall portion 122b.

Figure 11:
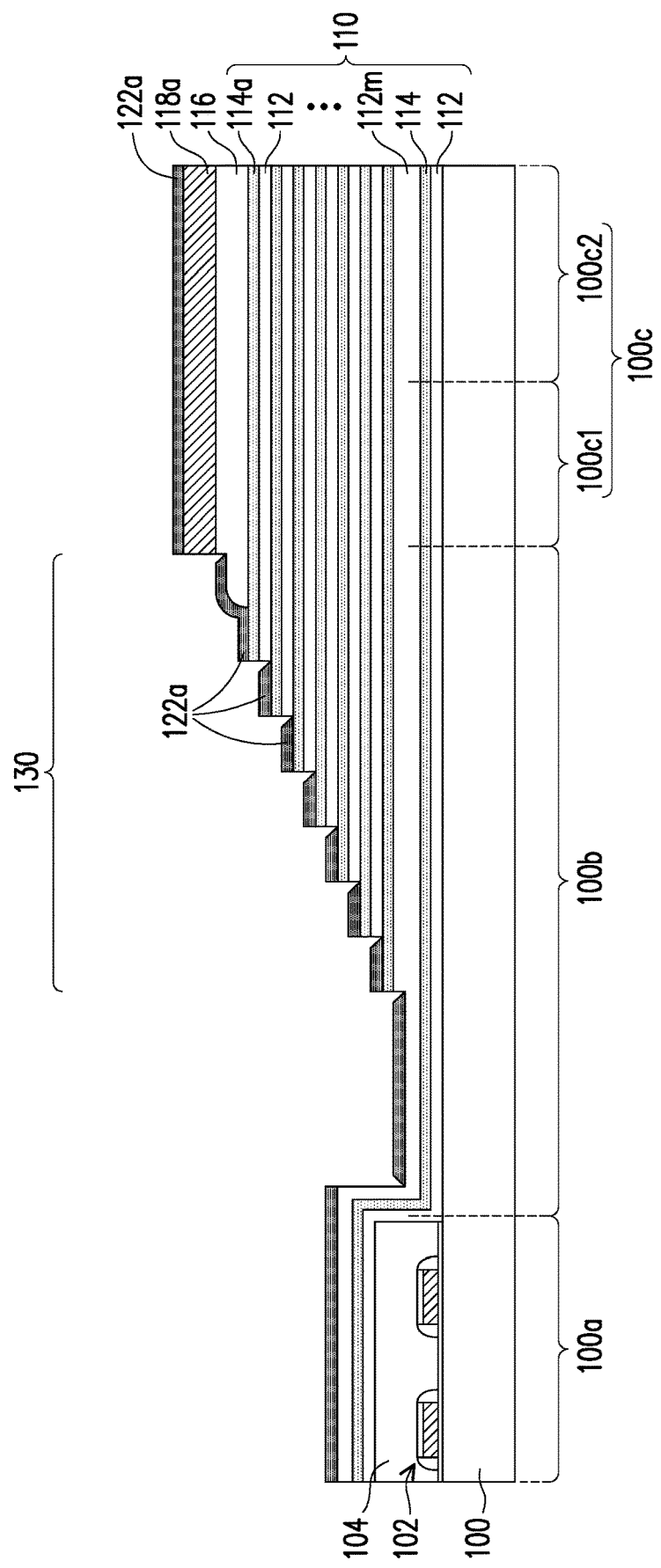
Figure 21:
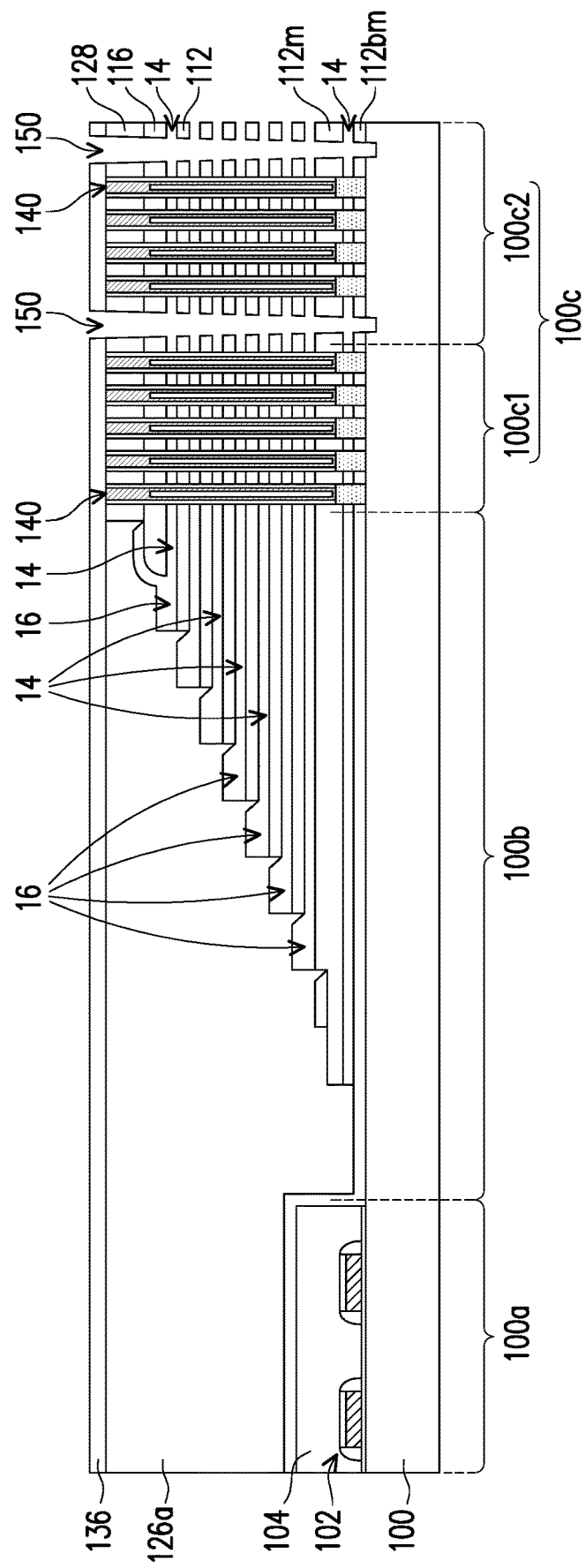
Figure 22:
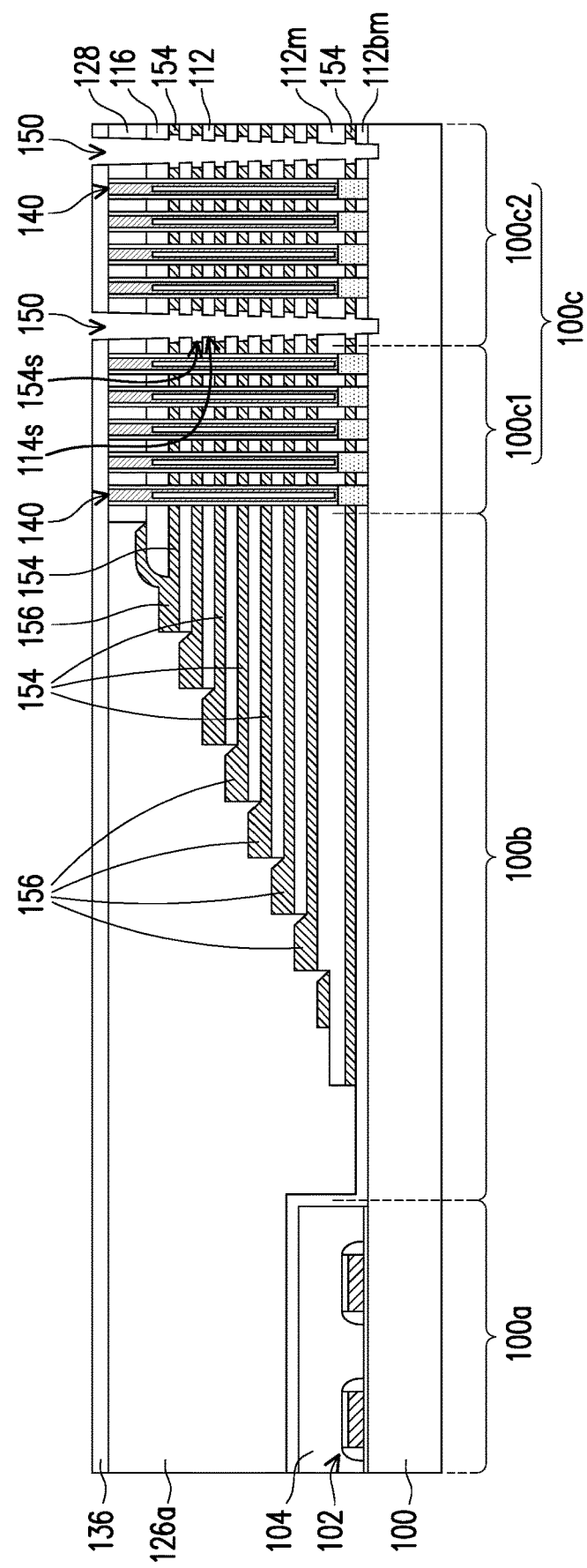

Referring to FIG. 11, a third etching process is performed to remove the sidewall portion 122b of the hard mask layer 122. The sidewall of the stop layer 118a and the sidewall of each stair in the staircase structure 130 are exposed. Specifically, since the thickness 122t2 of the sidewall portion 122b is less than the thickness 122t1 of the top surface portion 122a, the sidewall portion 122b may be completely removed in the third etching process, while the top surface portion 122a is thinned. In this case, as shown in FIG. 11, when the top surface portion 122a covers the top surface of the staircase structure 130, the sidewall of the staircase structure 130 is exposed. It should be noted that, in the embodiment, during the third etching process, the thicker protective layer 116 can be used to protect the underlying sacrificial layer 114a, so that the topmost sacrificial layer 114a between the staircase region 100b and the array region 100c will not be consumed. Therefore, after performing the subsequent gate replacement process (as shown in FIG. 21 to FIG. 22), the topmost conductive layer 154a may maintain a certain thickness to reduce the resistance value of the topmost conductive layer 154a.

Figure 12:
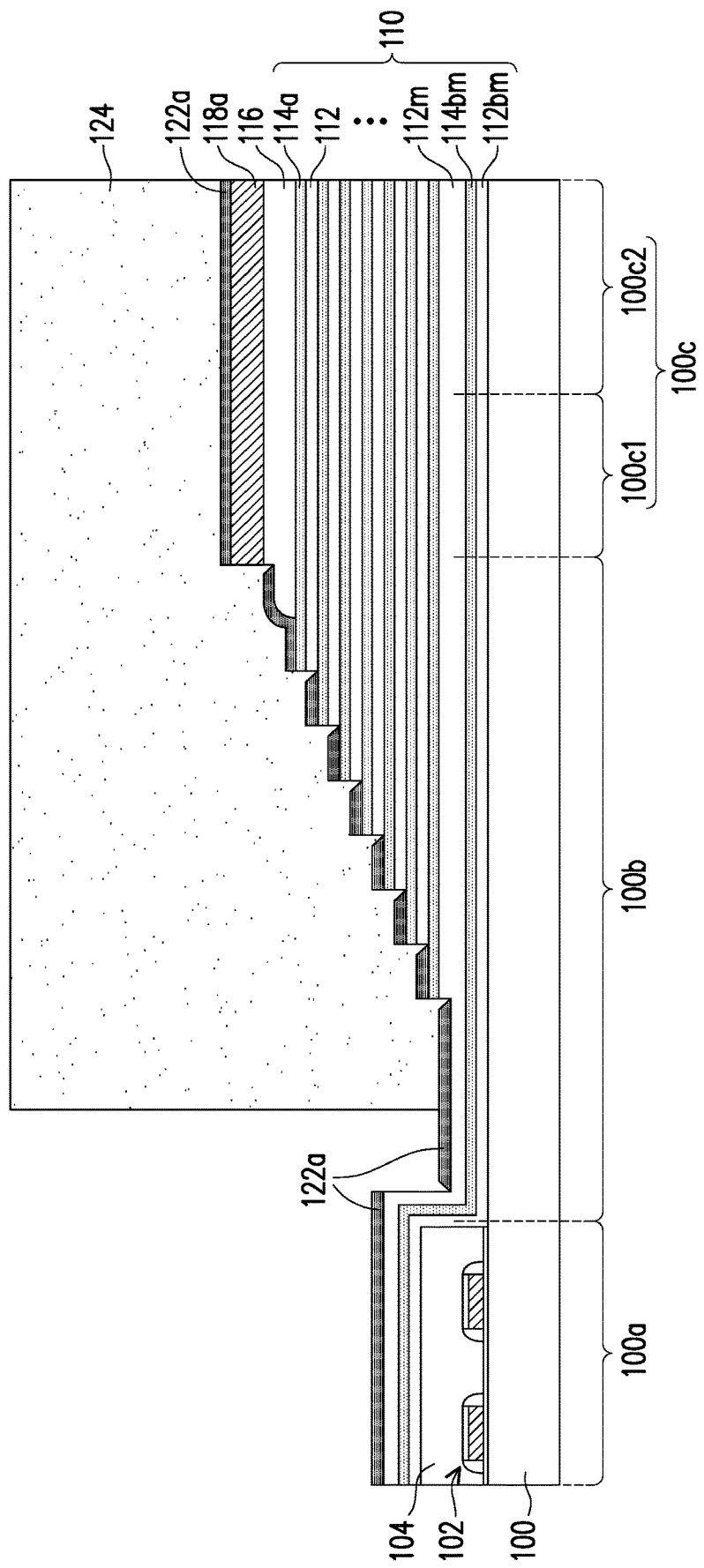

Referring to FIG. 12, a mask pattern 124 is formed to cover the array region 100c and a portion of the staircase region 100b. In an embodiment, a material of the mask pattern 124 includes a positive photoresist or a negative photoresist.

Figure 13:
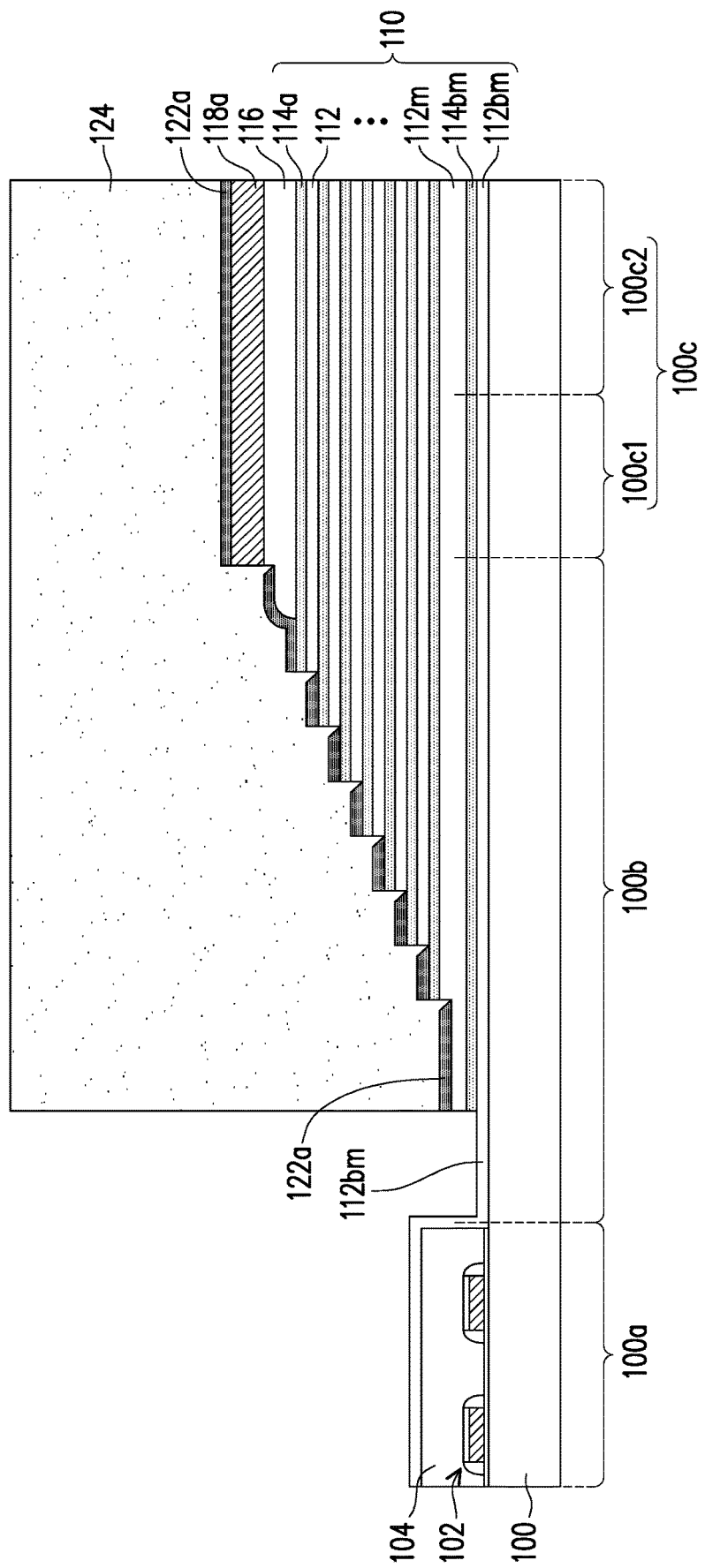

Referring to FIG. 13, by using the mask pattern 124 as a mask, the top surface portion 122a of the hard mask layer 122, the underlying dielectric layer 112m, and the bottommost sacrificial layer 114bm exposed by the mask pattern 124 are removed to expose the top surface of the bottommost dielectric layer 112bm. Specifically, this step can cut off the bottommost sacrificial layer 114bm, so that the terminal portion of the bottommost sacrificial layer 114bm ends at the staircase region 100b without extending on the peripheral region 100a. Therefore, after the subsequent gate replacement process (as shown in FIG. 21 to FIG. 22), the terminal portion of the bottommost conductive layer 154bm will also end at the staircase region 100b instead of extending on the peripheral region 100a.

Figure 14:
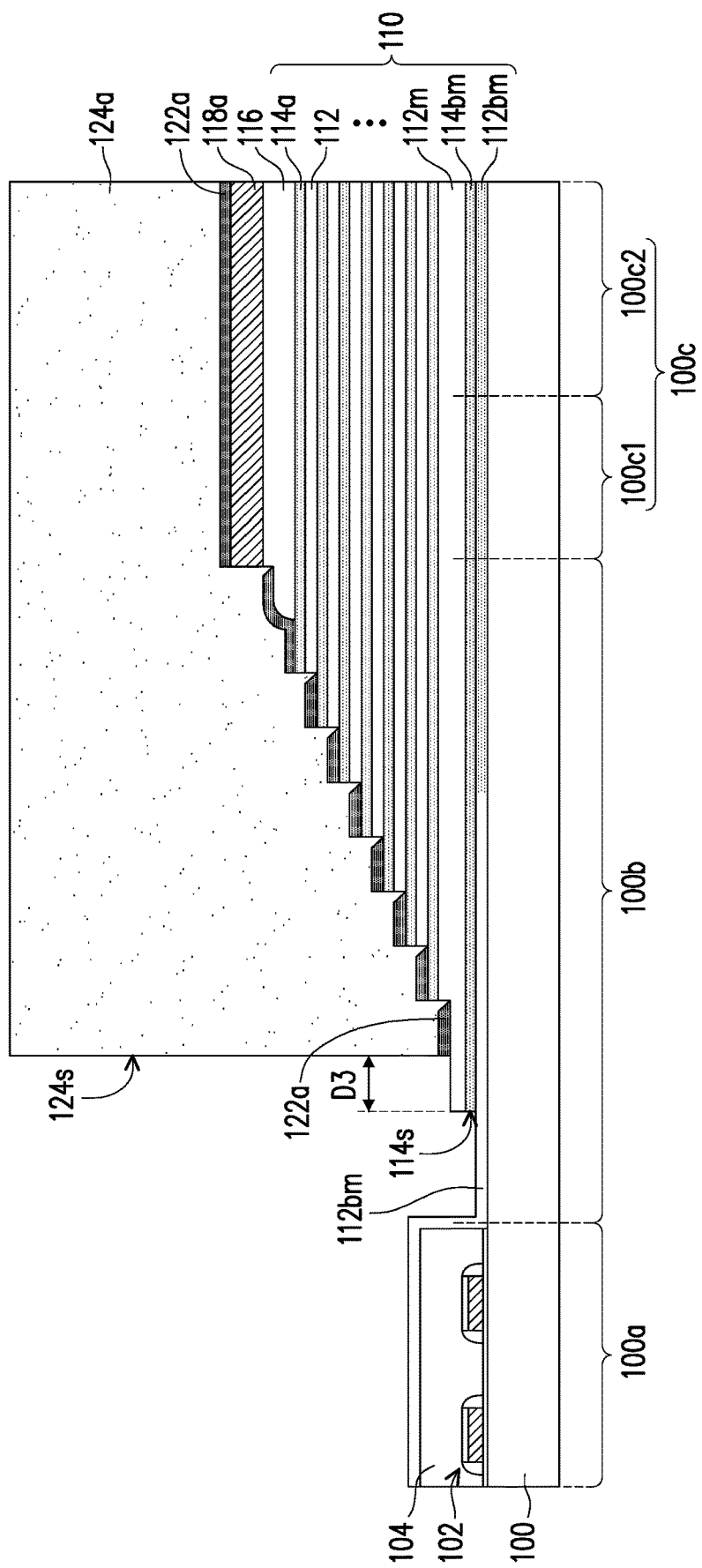
Figure 15:
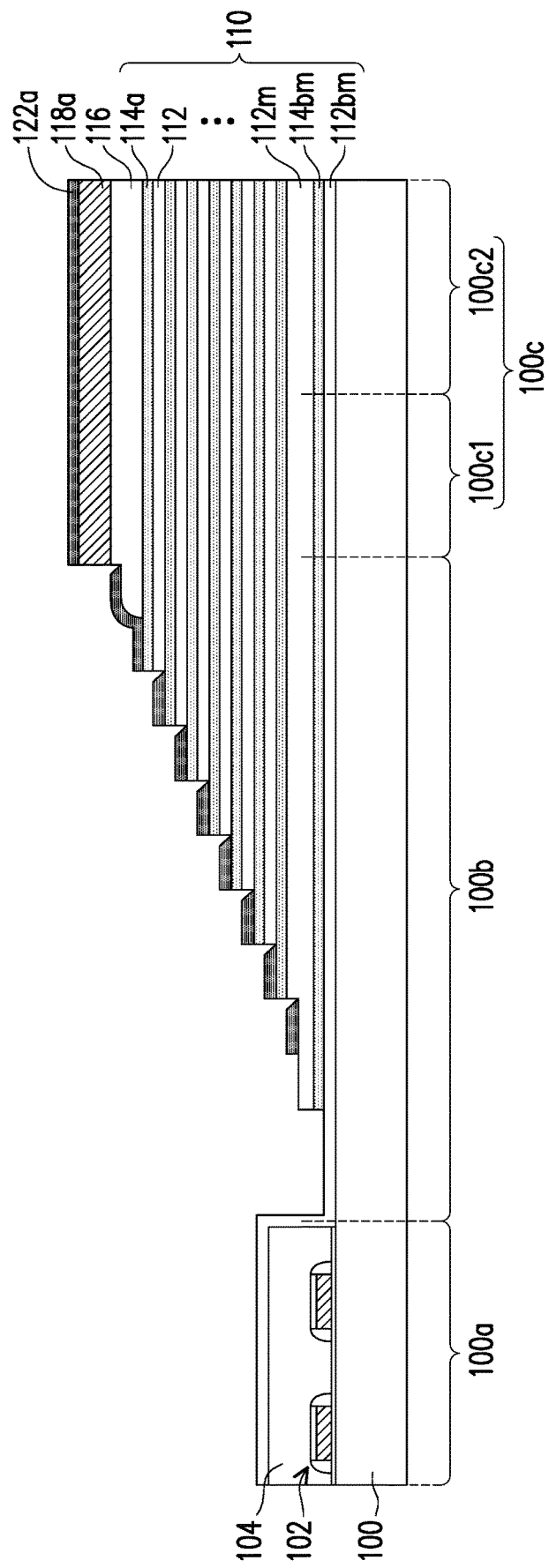

Referring to FIG. 14 and FIG. 15, the mask pattern 124 is trimmed, so that the sidewall 124s of the mask pattern 124a is recessed along a direction toward the array region 100c. That is, the sidewall 124s of the mask pattern 124a and the sidewall 114s of the bottommost sacrificial layers 114 are separated by a distance D3 greater than zero. Then, by using the mask pattern 124a as a mask, the top surface portion 122a of the hard mask layer 122 exposed by the mask pattern 124a is removed. After that, the mask pattern 124a is removed, as shown in FIG. 15.

Figure 16:
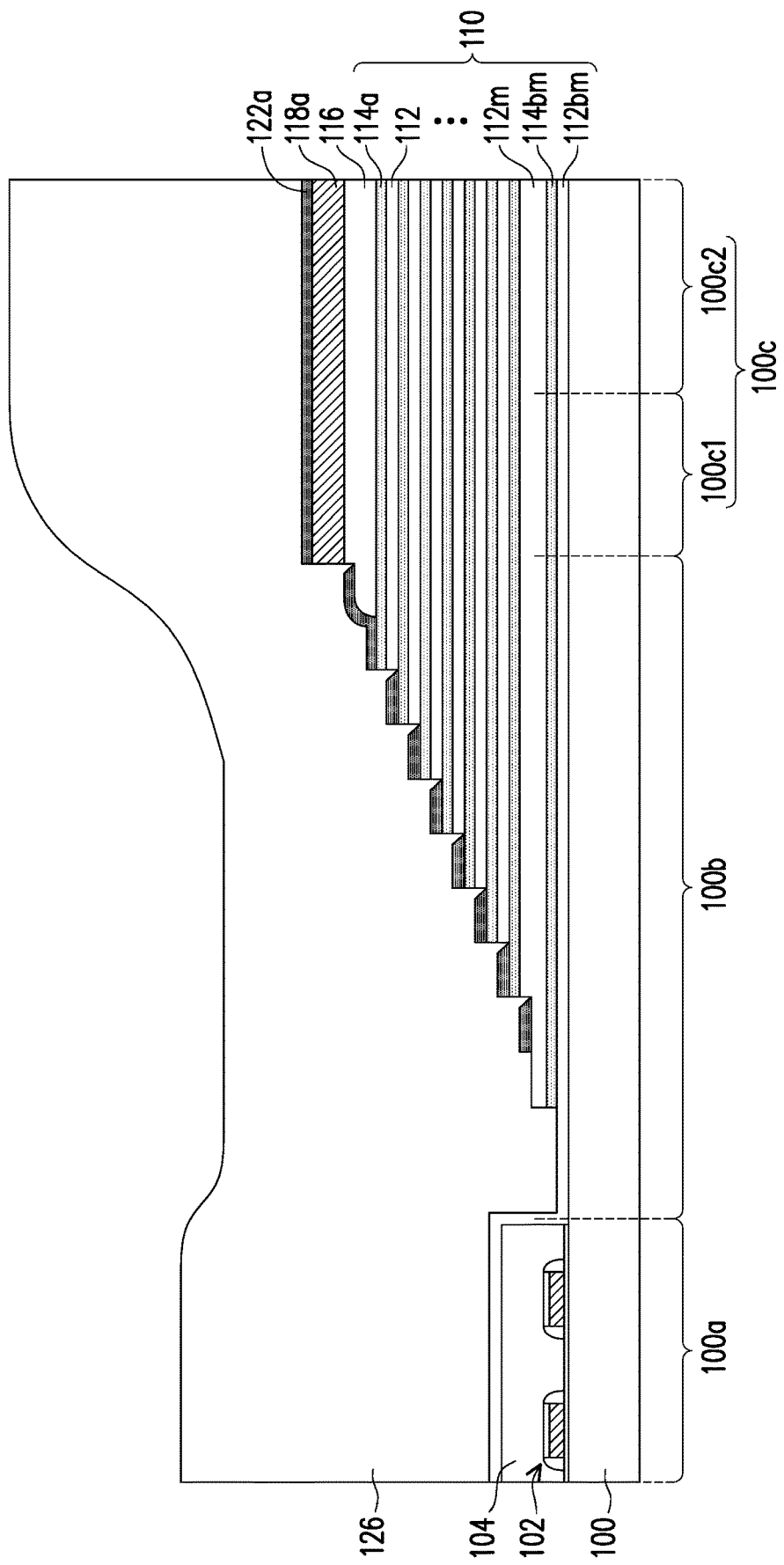

Referring to FIG. 16, a dielectric layer 126 is formed to cover the top surface of the structure of FIG. 15. In an embodiment, a material of the dielectric layer 126 may include silicon oxide, silicon nitride, silicon oxynitride, or a combination thereof; and the dielectric layer 126 may be formed by a deposition method, such as CVD and spin coating, etc.

Figure 17:
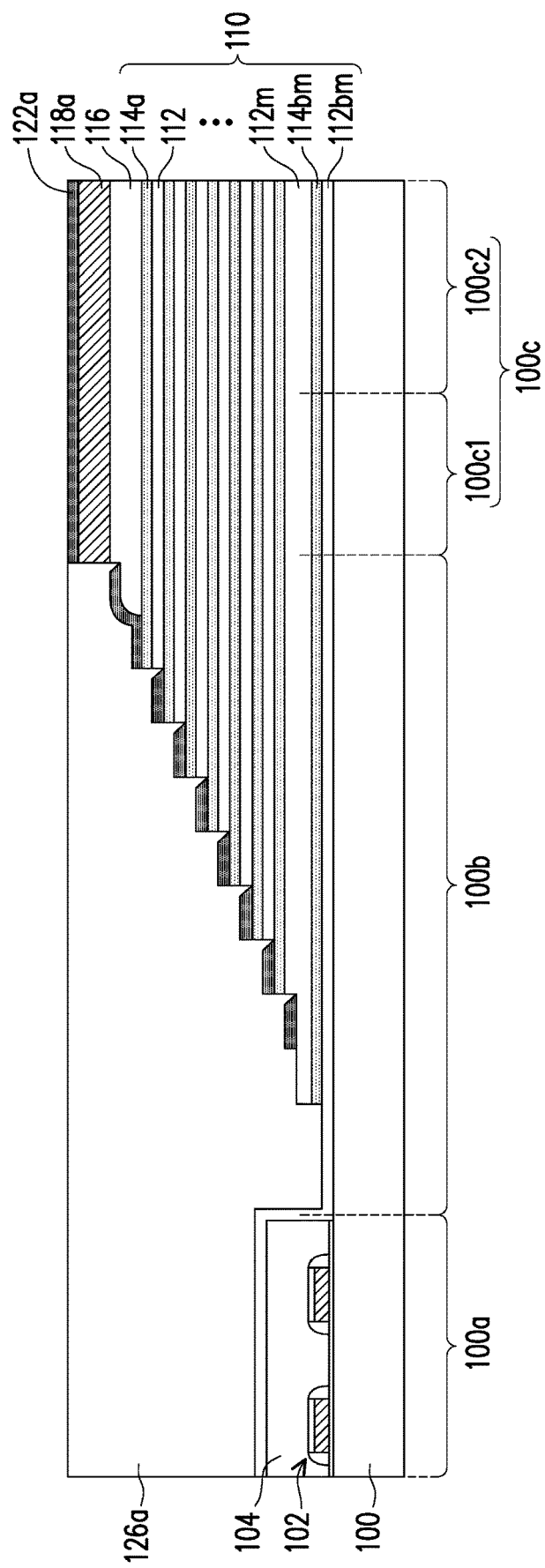

Referring to FIG. 17, a planarization process is performed to remove a portion of the dielectric layer 126 to expose the top surface portion 122a of the hard mask layer 122 on the array region 100c. In one embodiment, the planarization process may be a chemical mechanical polishing (CMP) process. In this case, the stop layer 118a and the top surface portion 122a of the hard mask layer 122 on the array region 100c can be used as a polishing stop layer in the CMP process to avoid damage to the protective layer 116 and the underlying sacrificial layers 114. After the planarization process, the top surface of the planarized dielectric layer 126a may be coplanar with the top surface of the top surface portion 122a on the array region 100c. In another embodiment, after the CMP process, the top surface portion 122a may be further removed, so that the top surface of the planarized dielectric layer 126a and the top surface of the stop layer 118a are coplanar.

Figure 18:
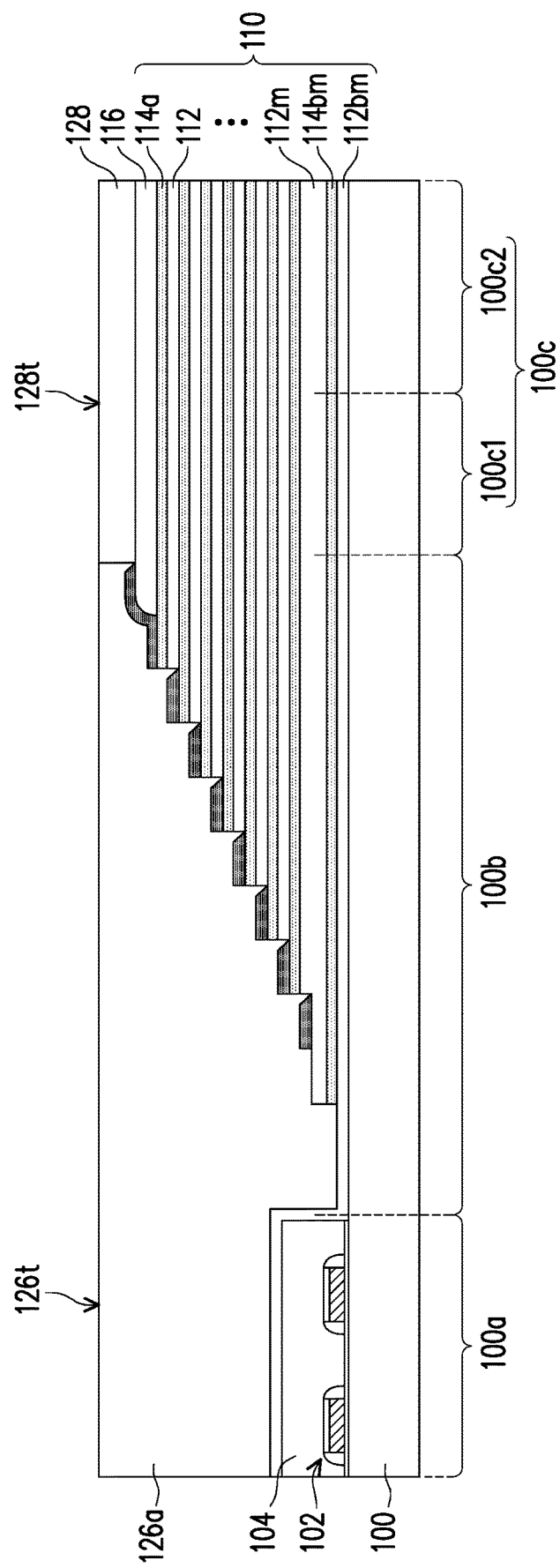

Referring to FIG. 17 and FIG. 18, the stop layer 118a and the top surface portion 122a of the hard mask layer 122 on the array region 100c are removed to form an opening. A dielectric material is formed to fill in the said openings, and a CMP process is then performed, so that a top surface 128t of a dielectric layer 128 on the array region 100c is coplanar with a top surface 126t of the dielectric layer 126a, as shown in FIG. 18.

Figure 19:
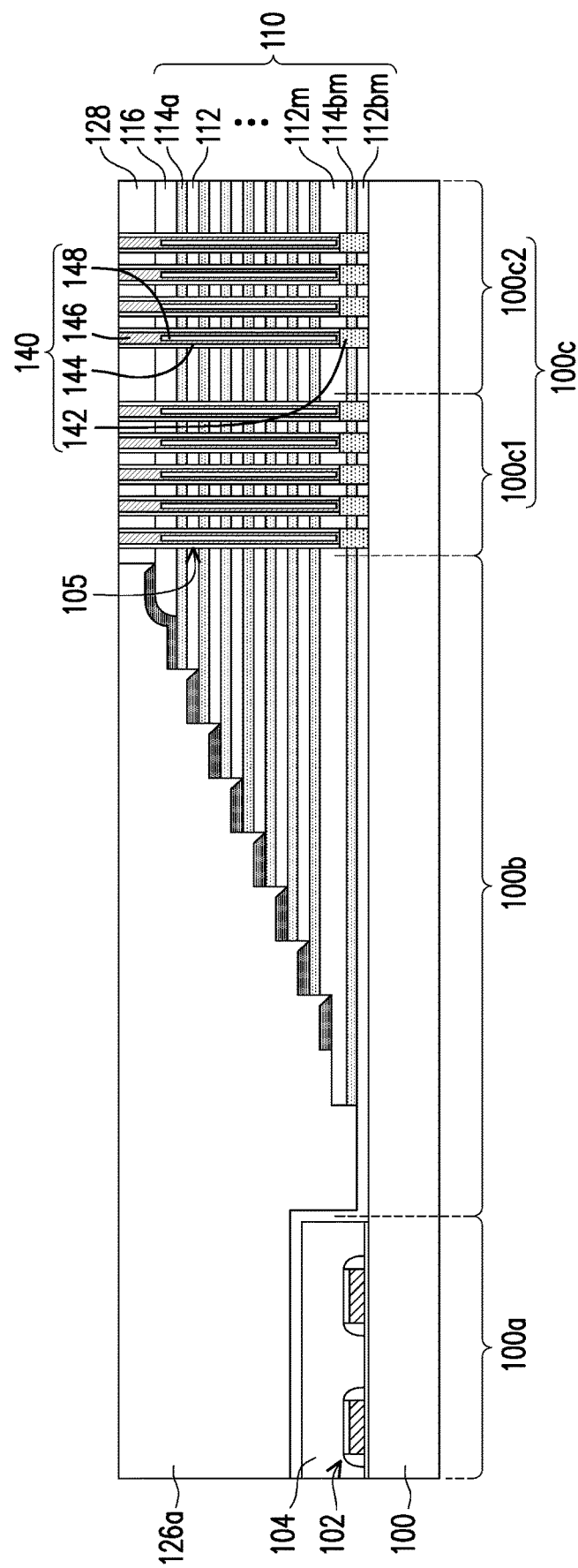

Referring to FIG. 19, a plurality of vertical channel structures 140 are formed on the array region 100c. Specifically, a plurality of openings 105 are formed in the dielectric layer 128, the protective layer 116, and the stack layer 110. The openings 105 penetrate through the stack layer 110 to expose the surface of the substrate 100 in the array region 100c. Next, the vertical channel structures 140 are formed in the openings 105, respectively. Each vertical channel structure 140 includes an epitaxial layer 142, a charge storage layer 144, a channel layer 146, and a dielectric pillar 148. The epitaxial layer 142 may be selectively epitaxially grown on the substrate 100 exposed by the opening 105. In an embodiment, a material of the epitaxial layer 142 may be derived from the substrate 100, such as epitaxial silicon. The epitaxial layer 142 can increase the conductive area to reduce the resistance value.

The charge storage layer 144 may be formed on the sidewall of the opening 105 in the form of a spacer. In an embodiment, the charge storage layer 144 may be a composite layer of an oxide layer/nitride layer/oxide layer (ONO).

The channel layer 146 and the dielectric pillar 148 may be formed by the following steps. First, a first channel material is formed in the opening 105 to conformally cover the charge storage layer 144 and the epitaxial layer 142. Next, a dielectric pillar 148 is formed in the opening 105. Then, a second channel material is formed on the dielectric pillar 148 to seal the top of the opening 105. In this case, the said second channel material is connected to the first channel material to form the channel layer 146, and the channel layer 146 encapsulates the dielectric pillar 148, as shown in FIG. 19. In one embodiment, a material of the channel layer 146 includes a semiconductor material, such as polysilicon. A material of the dielectric pillar 148 includes spin-on dielectric (SOD).

Figure 20:
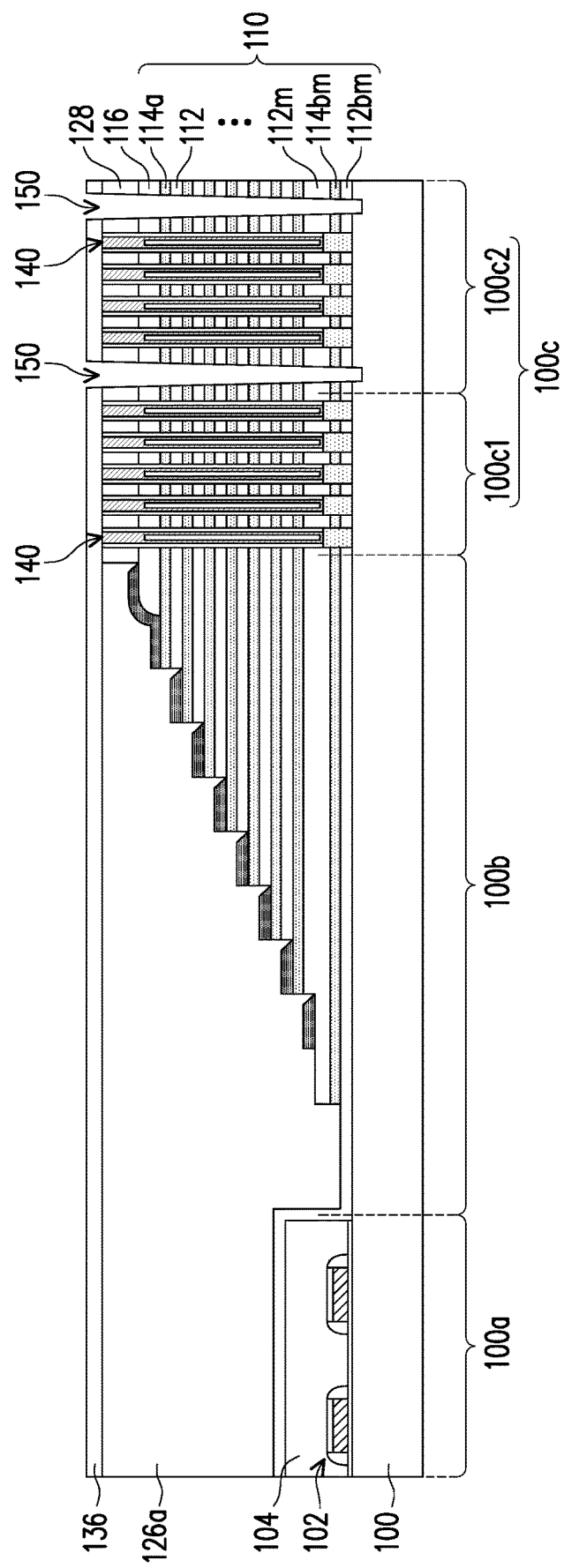

Referring to FIG. 20, one or more slits 150 are formed between the first array region 100c1 and the second array region 100c2. The slits 150 penetrate through the stack layer 110 to expose the surface of the substrate 100 in the array region 100c. In addition, before forming the slits 150, another dielectric layer 136 is further formed on the dielectric layers 126a and 128 to protect the vertical channel structures 140.

Referring to FIG. 21 and FIG. 22, a gate replacement process is performed to replace the sacrificial layers 114 and the hard mask layer 122a with a plurality of conductive layers 154 and a plurality of pads 156. Specifically, as shown in FIG. 21, a fourth etching process is performed to remove the sacrificial layers 114 to form a plurality of gaps 14 between the dielectric layers 112. The gaps 14 laterally expose a portion of the sidewall of the charge storage layer 144. In other words, the gaps 14 is defined by the dielectric layers 112 and the charge storage layer 144. In addition, the fourth etching process may be extended along the gaps 14 to further remove the hard mask layer 122a at the terminal portion of the sacrificial layers 114 (or gaps 14). Therefore, the gaps 16 is higher than the gaps 14 formed between the dielectric layers 112 in the staircase region 100b. The gaps 16 may be formed at the terminal portion of the gaps 14 and spatially communicated with the gaps 14. In one embodiment, the fourth etching process may be a wet etching process. For example, when the sacrificial layers 114 and the hard mask layer 122a are silicon nitride, the fourth etching process may use an etching solution containing phosphoric acid and pour the etching solution into the slits 150, thereby removing the sacrificial layers 114 and hard mask layer 122a. Since the etching solution has high etch selectivity for the sacrificial layers 114 and the hard mask layer 122a, the sacrificial layers 114 and the hard mask layer 122a may be completely removed, while the dielectric layers 112 and the charge storage layer 144 are not removed or only a small amount of the dielectric layers 112 and the charge storage layer 144 is removed.

Next, a plurality of conductive layers 154 are formed in the gaps 14 and a plurality of pads 156 are formed in the gaps 16. The pads 156 are higher of thicker than the conductive layers 154. In one embodiment, the conductive layer 154 and the pads 156 may be formed by forming a conductive material (not shown) to fill in the gaps 14 and 16 and cover the sidewalls of the slits 150. Afterwards, a fifth etching process is performed to remove the conductive material on the sidewalls of the slits 150. In order to completely remove the conductive material on the sidewalls of the slits 150, a portion of the conductive material in the gaps 14 is removed during the fifth etching process. In this case, as shown in FIG. 22, the sidewall 154s of the formed conductive layer 154 will be recessed from the sidewall 112s of the dielectric layers 112. In an embodiment, a material of the conductive layers 154 and the pads 156 includes metal, barrier metal, polysilicon, or a combination thereof, and the formation method thereof may be CVD or physical vapor deposition (PVD). For example, the conductive layers 154 and the pads 156 may be metal tungsten layers.

Figure 23:
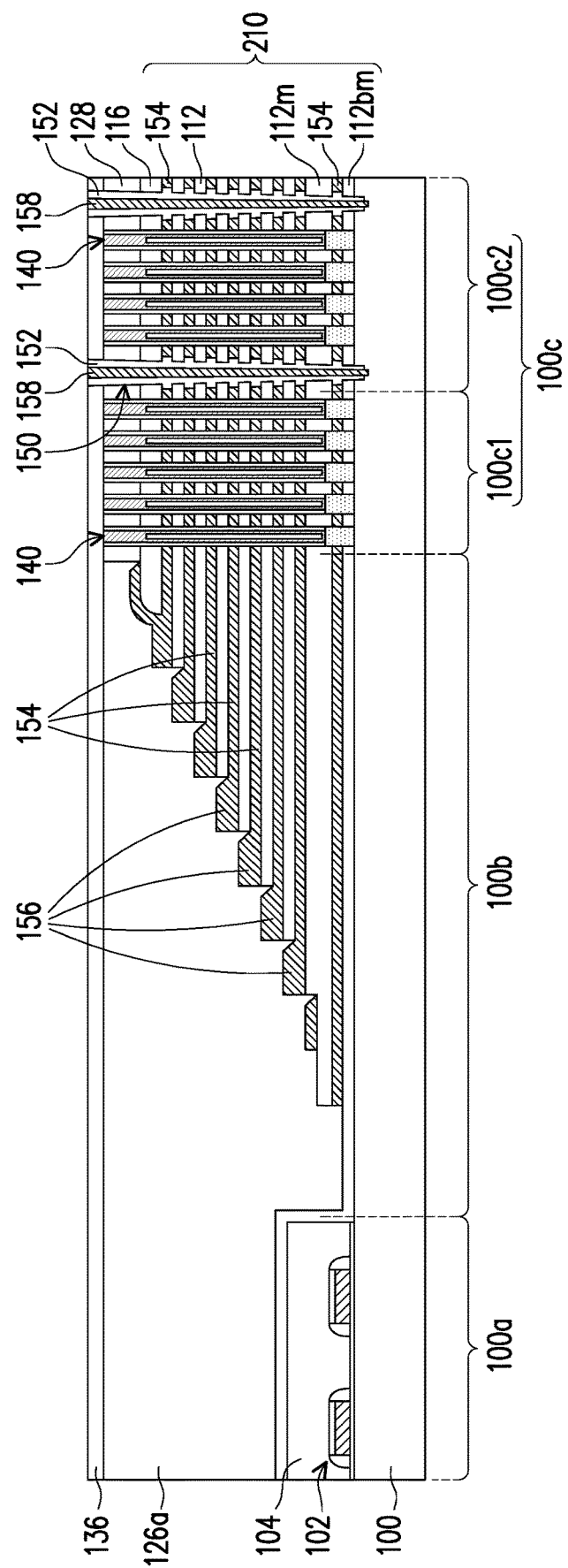

Referring to FIG. 23, a liner layer 152 is formed to conformally cover the surface of the slits 150. Specifically, the liner layer 152 further extends into the gaps 14 to contact the conductive layers 154. In one embodiment, a material of the liner layer 152 includes dielectric materials, such as silicon oxide, silicon nitride, and silicon oxynitride. Next, the liner layer 152 on the substrate 100 is removed to expose the top surface of the substrate 100. Then, a plurality of conductive pillars 158 are formed in the slits 150. As shown in FIG. 23, the conductive pillars 158 penetrate through a stack structure 210 to connect the substrate 100. In one embodiment, a material of the conductive pillars 158 includes metal, barrier metal, polysilicon, or a combination thereof, and the formation method thereof may be CVD or PVD. For example, the conductive pillar 158 may be a metal tungsten pillar.

Figure 24:
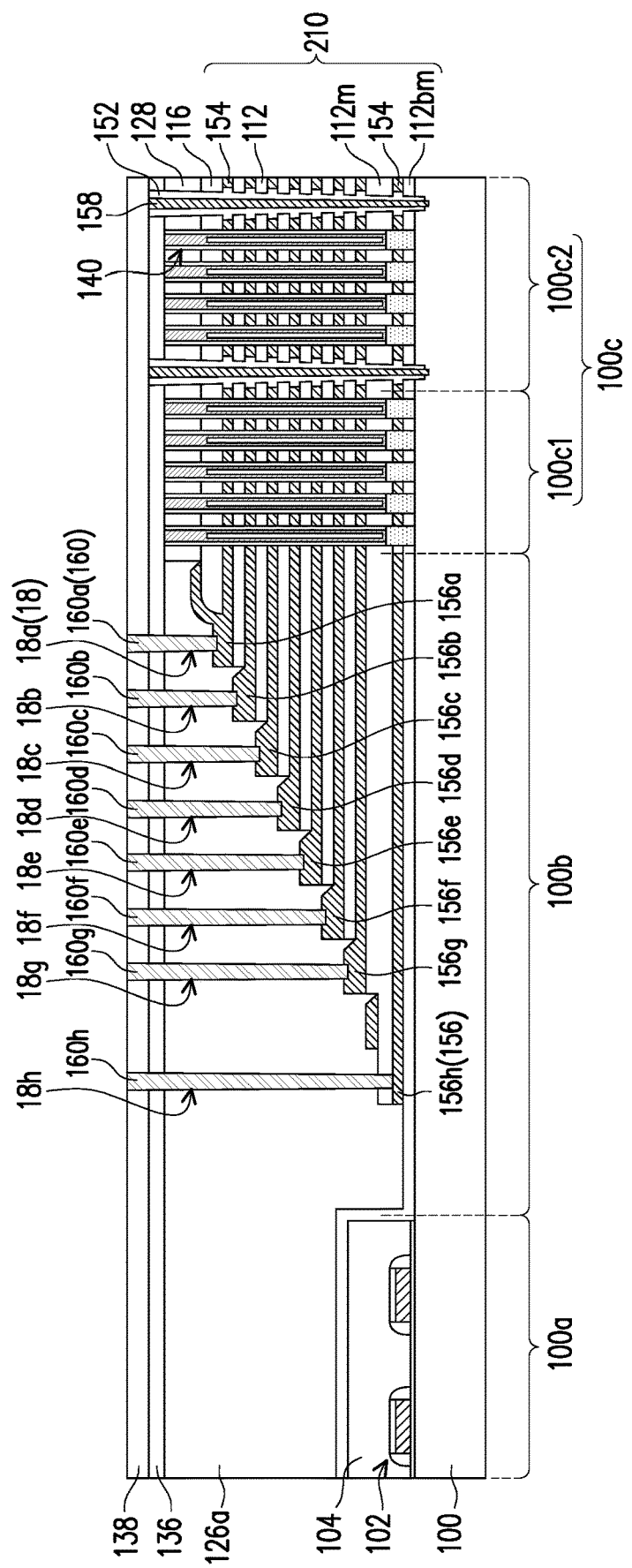

Referring to FIG. 24, a plurality of contact openings 18 are formed in the dielectric layer 126a on the staircase region 100b. The contact openings 18 (e.g., 18a-18h) respectively expose the surfaces of the pads 156 (e.g., 156a-156h). In addition, before forming the contact openings 18, another dielectric layer 138 may be further formed on the dielectric layer 136 to protect conductive pillars 158. In this case, the contact openings 18 penetrate through the dielectric layers 138, 136, and 126a to expose the pads 156. As shown in FIG. 24, the pads 156 can be used as an etching stop layer for forming the contact openings 18. Compared to the distance between the top surface of the pad 156h and the top surface of the dielectric layer 138, the distance between the top surface of the pad 156a and the top surface of the dielectric layer 138 is shorter; hence, during performing the contact opening process, the contact opening 18a firstly touches the top surface of the topmost pad 156a, so that the etching loss of the topmost pad 156a is more than other pads 156b-156h. Compared to the thickness of the conventional pads, the thickness of the pads 156 of the present embodiment is thicker, so as to prevent the over-etching during the contact opening process (especially the over-etching of the topmost pad 156a), thereby improving the process window of the contact opening process and increasing the yield. In addition, the distance between the bottommost pad 156h and the top surface of dielectric layer 138 is the longest, and the thickness of bottommost pad 156h and the conductive layer 154 have the same thickness that is less than the thickness of the topmost pad 156a, thus the bottommost pad 156h will not be over-etched during the contact opening process.

Then, a plurality of plugs 160 (e.g., 160a-160h) are respectively filled into the contact openings 18, so that the plugs 160 are connected to the pads 156 respectively. Therefore, the plugs 160 may be electrically connected to the conductive layers 154 through the pads 156, respectively. Specifically, the steps of filling the plugs 160 into the contact openings 18 respectively include performing a deposition process to fill in the contact openings 18 with a metal material so that the metal material covers the top surface of the dielectric layer 138. Then, a planarization process is performed to remove the metal material on the top surface of the dielectric layer 138. In an embodiment, the metal material includes copper, aluminum, aluminum copper, tungsten, or a combination thereof, and the formation method thereof may be CVD or PVD. In one embodiment, the material of the plugs 160 is the same as the material of the pads 156. In alternative embodiments, the material of the plugs 160 may be different from the material of the pads 156.

Referring to FIG. 25, an interconnect structure 170 is formed on the substrate 100 to accomplish the memory device 10. In one embodiment, the interconnect structure 170 may be electrically connected to the conductive layers 154 and/or the vertical channel structures 140. Specifically, the interconnect structure 170 may include a dielectric layer 172, conductive lines 174, and conductive vias 176. The conductive lines 174 and the conductive vias 176 are embedded in the dielectric layer 172. The conductive vias 176 are disposed between the adjacent conductive lines 174 to electrically connect the adjacent conductive lines 174. In an embodiment, a material of the dielectric layer 172 includes silicon oxide, silicon nitride, silicon oxynitride, or a combination thereof. A material of the conductive lines 174 and the conductive vias 176 may include a metal material, such as copper, aluminum, aluminum copper, or a combination thereof. The formation method of the conductive lines 174 and the conductive vias 176 may include a single damascene process or a dual damascene process. The said single damascene process or dual damascene process is well known to those with ordinary knowledge in the art, and will not be described in detail here.

As shown in FIG. 25, in the embodiment of the present invention, the memory device 10 includes the substrate 100, the stack structure 210, the pads 156, and the protective layer 116. The substrate 100 includes the peripheral region 100a, the staircase region 100b, and the array region 100c. The stack structure 210 is disposed on the substrate 100. The stack structure 210 includes the dielectric layers 112 and the conductive layers 154 stacked alternately. The pads 156 are disposed over the substrate 100 in the staircase region 100b. The pads 156 are respectively connected to the conductive layers 154 to form the staircase structure 130. In one embodiment, the thickness of each pad 156 is greater than or equal to the thickness of each conductive layer 154. Each pad 156 and the corresponding conductive layer 154 connected thereto may be located at the same level. For example, the topmost pad 156a and the topmost conductive layer 154a may both be located between the protective layer 116 and the topmost dielectric layers 112a. The topmost conductive layer 154a may extend in a direction parallel to the top surface of the substrate 100, and be connected to the topmost pad 156a at the terminal portion of the topmost conductive layer 154a.

In one embodiment, the bottommost conductive layer 154bm may be used as a ground select line (GSL), the topmost conductive layer 154a may be used as a string select line (SSL), and other conductive layers 154 between the bottommost conductive layer 154bm and the topmost conductive layer 154a may be used as word lines (WLs). In alternative embodiments, the topmost three conductive layers 154 may also be used as string selection lines (SSLs). The dielectric layer 112m is disposed on the bottommost conductive layer 154bm to separate the bottommost conductive layer 154bm from other conductive layers 154 thereon. In addition, the conductive layer 154m may be remained or embedded in the dielectric layer 112m. The conductive layer 154m may be formed by the process step illustrated in FIG. 14, and the length of the conductive layer 154m may be adjusted by the distance D3 of FIG. 14. In an embodiment, the conductive layer 154m may be electrically floating without being connected to other elements.

In the present embodiment, the protective layer 116 is disposed on the stack structure 210 to contact the topmost conductive layer 154a. The top surface 115 of the protective layer 116 close to the topmost pad 156a has a curved or arc profile. The topmost pad 156a have an extension portion 157 extending and covering the curved top surface 115 of the protective layer 116. As shown in FIG. 25, the extension portion 157 has an extension distance D4 from an edge of the curved profile of the protective layer 116 to an end of the extension portion 157. The extension distance D4 corresponds to the distance D1 of FIG. 5, which may be 100 nm to 1000 nm, for example. It should be noted that the thicker protective layer 116 can protect the underlying string selection line SSL to maintain a certain thickness and resistance value, thereby improving the gate control of the string selection line SSL.

Further, in addition to the above-mentioned embodiments, the concept of the thicker protective layer may also be applied to other devices with the staircase region. For example, the 3D NAND flash memory having floating gate type (FG type), charge trapped type (CT type), complementary metal oxide semiconductor (CMOS) under Array (CuA), and CMOS near array, or the like.

In summary, in the embodiment of the present invention, the thicker protective layer is used to protect the underlying sacrificial layer, so that the topmost sacrificial layer between the staircase region and the array area will not be consumed.

Therefore, after performing the gate replacement process, the topmost conductive layer can maintain a certain thickness to reduce the resistance value of the topmost conductive layer, thereby improving the gate control of the topmost conductive layer.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
   a substrate, having an array region and a staircase region;
   a stack structure, disposed on the substrate, wherein the stack structure comprises a plurality of dielectric layers and a plurality of conductive layers stacked alternately;
   a plurality of pads, disposed on the substrate in the staircase region, wherein the plurality of pads are respectively connected to the plurality of conductive layers, so as to form a staircase structure;
   an additional dielectric layer, disposed on the stack structure to contact a topmost conductive layer of the plurality of conductive layers; and
   a topmost pad of the plurality of pads including a landing portion to contact a plug and an extension portion, wherein the landing portion is laterally adjacent to the additional dielectric layer, and the extension portion extends over a top surface of the additional dielectric layer.

2. The memory device according to claim 1, further comprising at least one plug connected to the landing portion of the topmost pad.

3. The memory device according to claim 2, wherein the at least one plug and the topmost pad have a same material.

4. The memory device according to claim 1, wherein each pad of the plurality of pads and a corresponding conductive layer connecting thereto are located at a same level.

5. The memory device according to claim 1, wherein the plurality of pads are respectively laterally connected to the plurality of conductive layers.

6. The memory device according to claim 5, wherein pads in the plurality of pads have a thickness greater than or equal to a thickness of the respective conductive layers.

7. The memory device according to claim 1, further comprising a plurality of plugs connected to respective pads in the plurality of pads.

8. The memory device according to claim 1, wherein the substrate further comprises a complementary metal oxide semiconductor under array.

9. The memory device according to claim 1, wherein the extension portion has an extension distance from an edge of the additional dielectric layer to an end of the extension portion.

10. The memory device according to claim 1, the topmost conductive layer is a string select line.

11. A memory device, comprising:
    a substrate, having an array region and a staircase region;
    a stack structure, disposed on the substrate, wherein the stack structure comprises a plurality of dielectric layers and a plurality of conductive layers stacked alternately;
    a plurality of pads, disposed on the substrate in the staircase region, wherein the plurality of pads are respectively connected to the plurality of conductive layers, so as to form a staircase structure; and
    an additional dielectric layer, disposed on the stack structure to contact a topmost conductive layer of the plurality of conductive layers; and
    a topmost pad of the plurality of pads including a landing portion to contact a plug and an extension portion, wherein the landing portion is not covered by the additional dielectric layer, and the extension portion covers a top surface of the additional dielectric layer.

12. The memory device according to claim 11, further comprising at least one plug connected to the landing portion of the topmost pad.

13. The memory device according to claim 12, wherein the at least one plug and the topmost pad have a same material.

14. The memory device according to claim 11, wherein each pad of the plurality of pads and a corresponding conductive layer connecting thereto are located at a same level.

15. The memory device according to claim 11, wherein the plurality of pads are respectively laterally connected to the plurality of conductive layers.

16. The memory device according to claim 15, wherein pads in the plurality of pads have a thickness greater than or equal to a thickness of the respective conductive layers.

17. The memory device according to claim 11, further comprising a plurality of plugs connected to respective pads in the plurality of pads.

18. The memory device according to claim 11, wherein the substrate further comprises a complementary metal oxide semiconductor under array.

19. The memory device according to claim 11, wherein the extension portion has an extension distance from an edge of the additional dielectric layer to an end of the extension portion.

20. The memory device according to claim 11, the topmost conductive layer is a string select line.

* * * * *